(12) United States Patent
Hayashiguchi et al.

(10) Patent No.: US 12,557,702 B2
(45) Date of Patent: Feb. 17, 2026

(54) SEMICONDUCTOR DEVICE COMPRISING PLURALITY OF SWITCHING ELEMENTS AND RECTIFIER ELEMENTS FOR PREVENTING EXCESSIVE CURRENT

(71) Applicant: ROHM CO., LTD., Kyoto (JP)

(72) Inventors: Masashi Hayashiguchi, Kyoto (JP); Kenichi Onodera, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 567 days.

(21) Appl. No.: 18/009,920

(22) PCT Filed: Sep. 9, 2021

(86) PCT No.: PCT/JP2021/033155
§ 371 (c)(1),
(2) Date: Dec. 12, 2022

(87) PCT Pub. No.: WO2022/075003
PCT Pub. Date: Apr. 14, 2022

(65) Prior Publication Data
US 2023/0246001 A1 Aug. 3, 2023

(30) Foreign Application Priority Data
Oct. 6, 2020 (JP) ................. 2020-169285

(51) Int. Cl.
*H01L 25/07* (2006.01)
*H01L 21/52* (2006.01)
(Continued)

(52) U.S. Cl.
CPC ........... *H01L 25/072* (2013.01); *H01L 21/52* (2013.01); *H01L 23/051* (2013.01); *H01L 24/06* (2013.01);
(Continued)

(58) Field of Classification Search
CPC ......... H01L 25/072; H01L 2924/13052; H01L 2924/13091; H01L 21/52; H01L 2924/181;
(Continued)

(56) References Cited

U.S. PATENT DOCUMENTS

2012/0256194 A1* 10/2012 Yoshihara ............. H01L 23/645
257/77
2015/0223339 A1* 8/2015 Nakamura ........... H05K 7/2089
361/779
(Continued)

FOREIGN PATENT DOCUMENTS

JP 2007-336643 A 12/2007
JP 2016-225493 A 12/2016
(Continued)

OTHER PUBLICATIONS

Office Action issued in corresponding Japanese Patent application No. 2022-555325, Jun. 3, 2025, and machine translation (5 pages).
(Continued)

*Primary Examiner* — Didarul A Mazumder
(74) *Attorney, Agent, or Firm* — HSML P.C.

(57) ABSTRACT

A semiconductor device includes: a plurality of semiconductor elements connected in parallel; a rectifier element connected in anti-parallel to the plurality of semiconductor elements; a power terminal electrically connected to the plurality of semiconductor elements; and an electrical conductor electrically connected to the power terminal and the plurality of semiconductor elements and including a pad portion to which the plurality of semiconductor elements are bonded. The plurality of first semiconductor elements include a first element and a second element. The minimum conduction path of the first element to the power terminal is shorter than the minimum conduction path of the second element to the power terminal. The pad portion includes a
(Continued)

first section to which the first element is bonded and a second section to which the second element is bonded. The rectifier element is located in the first section of the pad portion.

20 Claims, 16 Drawing Sheets

(51) Int. Cl.
 *H01L 23/00* (2006.01)
 *H01L 23/051* (2006.01)
(52) U.S. Cl.
 CPC ...... *H01L 24/49* (2013.01); *H01L 2224/0603* (2013.01); *H01L 2224/4903* (2013.01); *H01L 2224/4917* (2013.01)
(58) Field of Classification Search
 CPC ......... H01L 24/49; H01L 24/48; H01L 24/45; H01L 24/40; H01L 2224/73221; H01L 2224/0603; H01L 24/06; H01L 2224/4903; H01L 2224/4917; H01L 2924/19107
 USPC .......................................................... 257/690
 See application file for complete search history.

(56) References Cited

U.S. PATENT DOCUMENTS

2018/0033720 A1\* 2/2018 Tsukamoto ........... H02M 3/155
2020/0013703 A1\* 1/2020 Matsuo .................. H01L 23/04

FOREIGN PATENT DOCUMENTS

WO WO-2010131679 A1 \* 11/2010 ............. H01L 25/18
WO 2018/168924 A1 9/2018

OTHER PUBLICATIONS

International Search Report issued in PCT/JP2021/033155, Nov. 9, 2021 (2 pages).

\* cited by examiner

SEMICONDUCTOR DEVICE COMPRISING PLURALITY OF SWITCHING ELEMENTS AND RECTIFIER ELEMENTS FOR PREVENTING EXCESSIVE CURRENT

TECHNICAL FIELD

The present disclosure relates to semiconductor devices.

BACKGROUND ART

In recent years, semiconductor devices incorporating semiconductor elements such as metal-oxide-semiconductor field-effect transistors (MOSFETs) and insulated gate bipolar transistors (IGBTs) have been known. In one example, a semiconductor device includes two serially connected semiconductor elements (a first semiconductor element and a second semiconductor element) and operates to convert direct current (DC) voltage to alternating current (AC) voltage by switching the semiconductor elements on and off. The current-carrying capacity of such a semiconductor device can be increased by connecting a plurality of first semiconductor elements in parallel and a plurality of second semiconductor elements in parallel (see Patent Document 1). According to Patent Document 1, the device includes a plurality of first semiconductor elements connected in parallel and a plurality of second semiconductor elements in parallel, and each of the parallel-connected first semiconductor elements is serially connected to each of the parallel-connected second semiconductor elements. Each of the first and second semiconductor elements is implemented by an MOSFET, which intrinsically contains a body diode.

PRIOR ART DOCUMENT

Patent Document

Patent Document 1: JP-A-2016-225493

SUMMARY OF THE INVENTION

Problem to be Solved by the Invention

During operation of the semiconductor device disclosed in Patent Document 1, a surge current can be induced in the first and second semiconductor elements by switching of the first and second semiconductor elements. The serge current flows through the body diodes of the semiconductor elements in the reverse direction of the semiconductor elements (that is, in the forward direction of the body diodes). If an excessive current resulting from the surge current flows through the body diodes, it can adversely affect the characteristics of the semiconductor elements (for example, increase of on-resistance).

In view of the circumstances described above, an aim of the present disclosure is to provide a semiconductor device configured to prevent an excessive current flowing through the body diodes of the semiconductor elements and hence prevent deterioration of the characteristic of the semiconductor elements.

Means to Solve the Problem

A semiconductor device according to the present disclosure includes: a plurality of first semiconductor elements configured to perform a switching operation and electrically connected to each other in parallel; one or more first rectifier elements electrically connected in anti-parallel to the plurality of first semiconductor elements; a first power terminal electrically connected to each of the plurality of first semiconductor elements; and a first electrical conductor electrically connected to the first power terminal and the plurality of first semiconductor elements and also including a first pad portion to which the plurality of first semiconductor elements are bonded. The plurality of first semiconductor elements include a first element and a second element that are mutually different in length of a minimum conduction path to the first power terminal. The minimum conduction path of the first element is shorter than the minimum conduction path of the second element. The first pad portion includes a first section to which at least the first element out of the plurality of first semiconductor elements is bonded and a second section to which at least the second element out of the plurality of first semiconductor elements is bonded. The one or more first rectifier elements are fewer in number than the plurality of first semiconductor elements. The one or more first rectifier elements include a first rectifier element located in the first section.

Advantages of Invention

The configuration of the present disclosure can prevent an excessive current from flowing through the body diodes of the semiconductor elements and thus prevent deterioration of the characteristic of the semiconductor elements.

MODE FOR CARRYING OUT THE INVENTION

Figure 1:
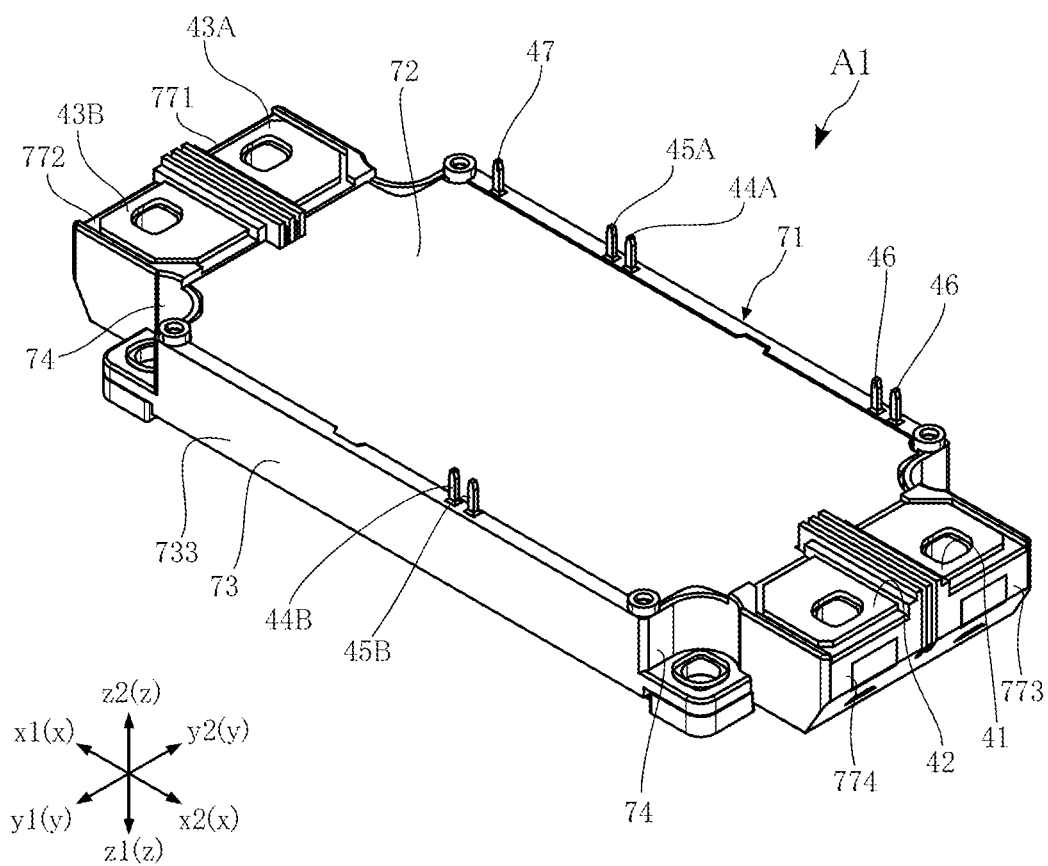
FIG. 1 is a perspective view of a semiconductor device according to a first embodiment.

The following describes preferred embodiments of semiconductor devices according to the present disclosure with reference to the drawings. In the following description, the same or similar components are denoted by the same reference signs and an overlapping description of such a component is omitted.

FIGS. 1 to 15 show a semiconductor device A1 according to a first embodiment. The semiconductor device A1 includes semiconductor elements 10A and 10B, rectifier elements 20A and 20B, a supporting member 3, power terminals 41, 42, 43A and 43B, a pair of signal terminals 44A and 44B, sensing terminals 45A, 45B, 46 and 47, connecting members 51, 52, 53A, 53B, 54A, 54B, 55A, 55B, 56A, 56A, 57A, 57B and 58, a heat-dissipating plate 70 and a casing 71.

Figure 2:
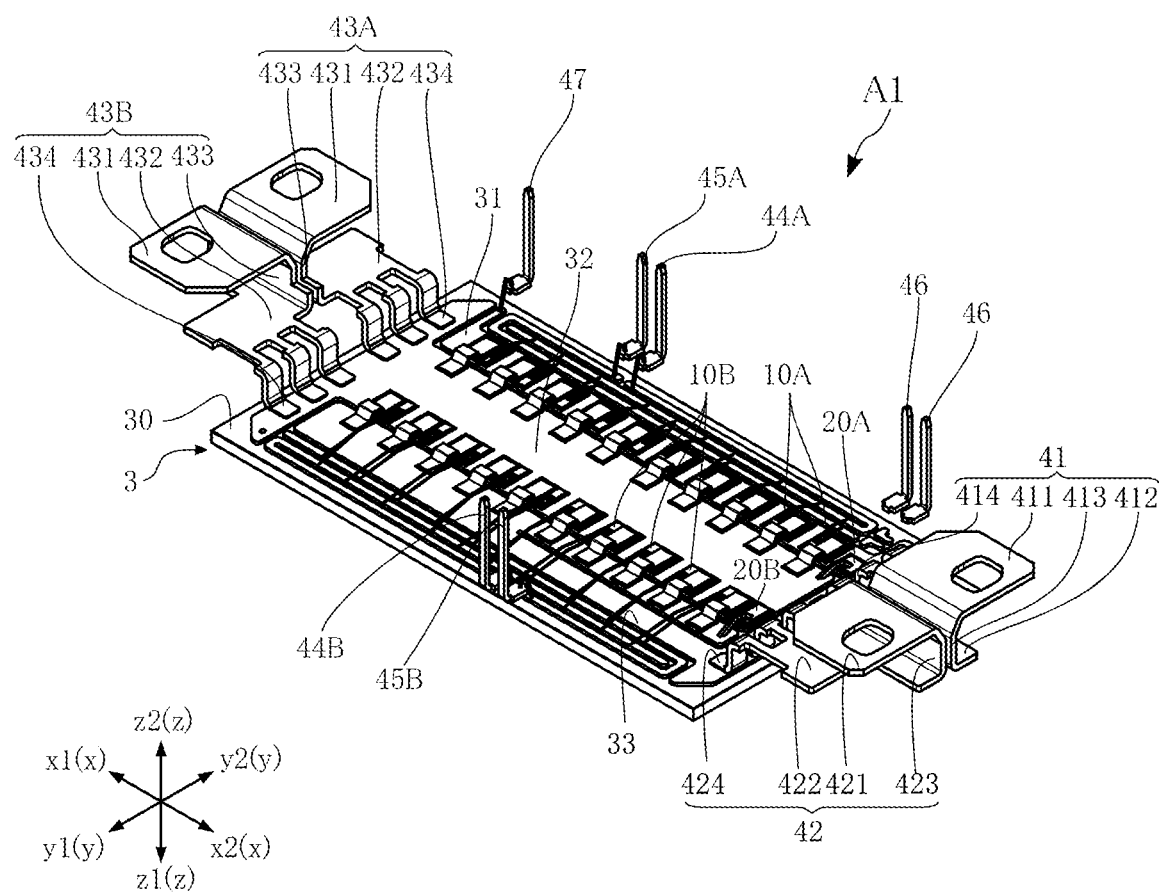
FIG. 2 is a perspective view similar to FIG. 1, with the heat-dissipating plate and the casing omitted.
Figure 3:
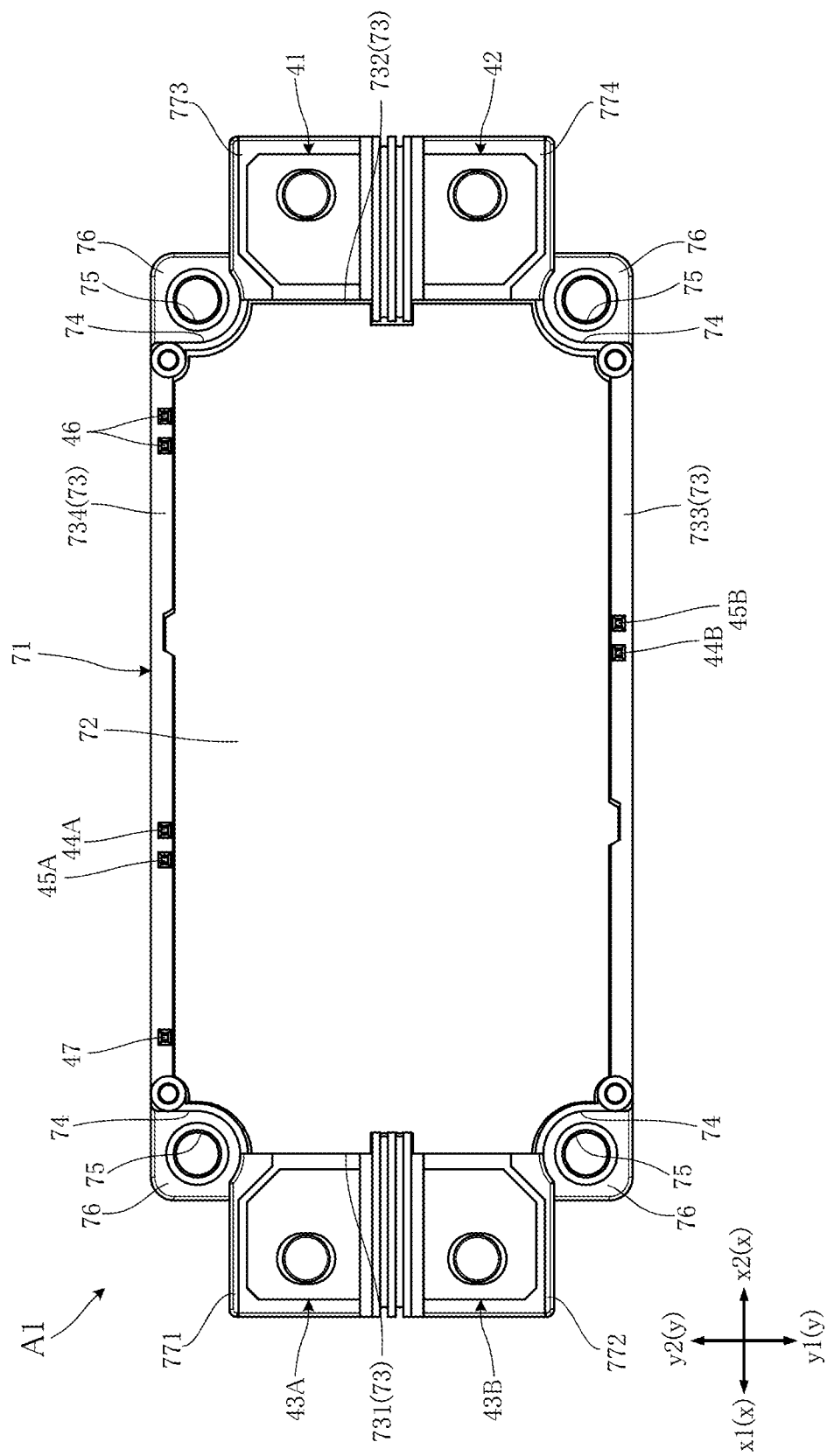
FIG. 3 is a plan view of the semiconductor device according to the first embodiment.
Figure 4:
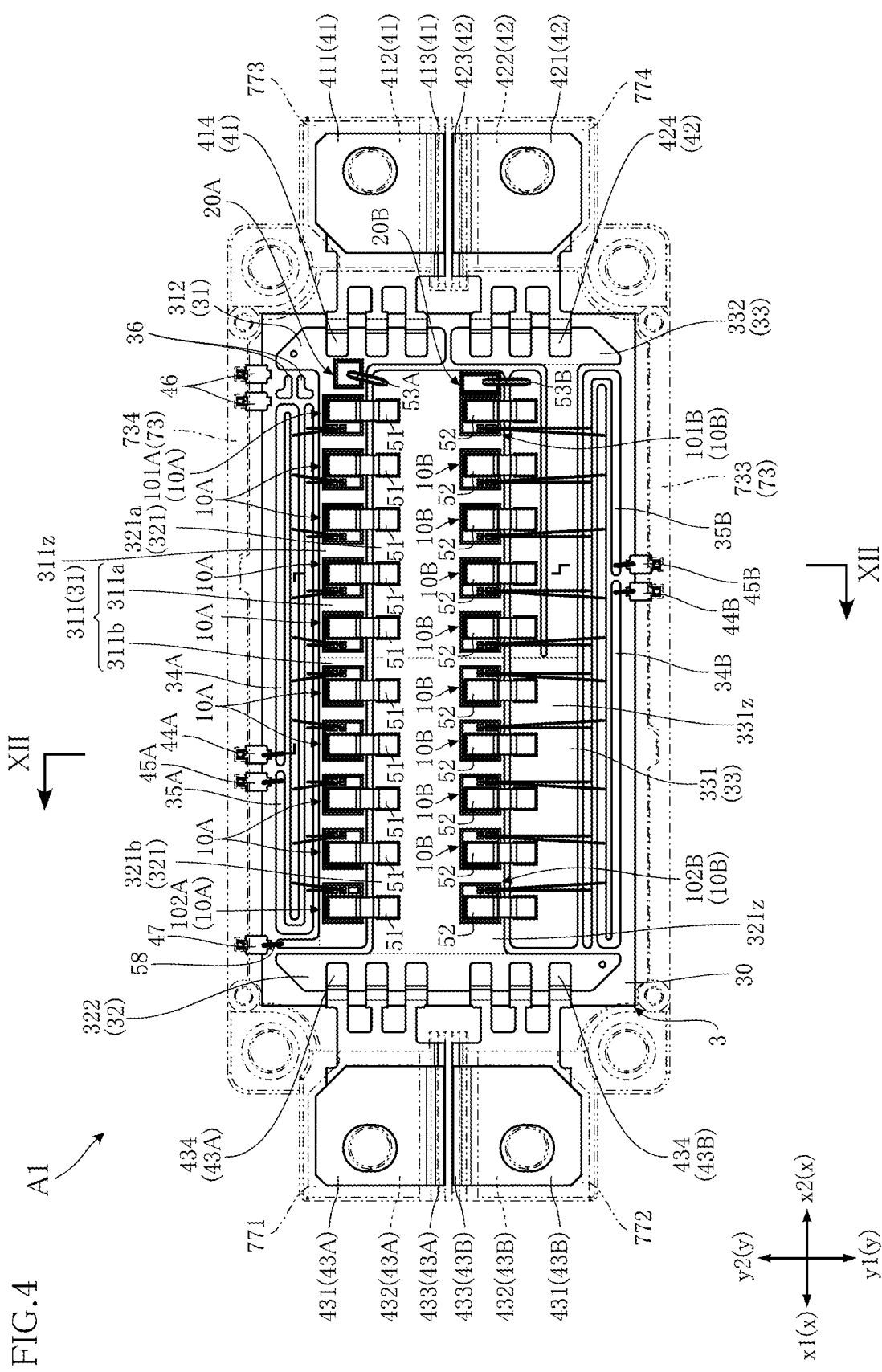
FIG. 4 is a plan view similar to FIG. 3, with the heat-dissipating plate and the casing shown in phantom.
Figure 5:
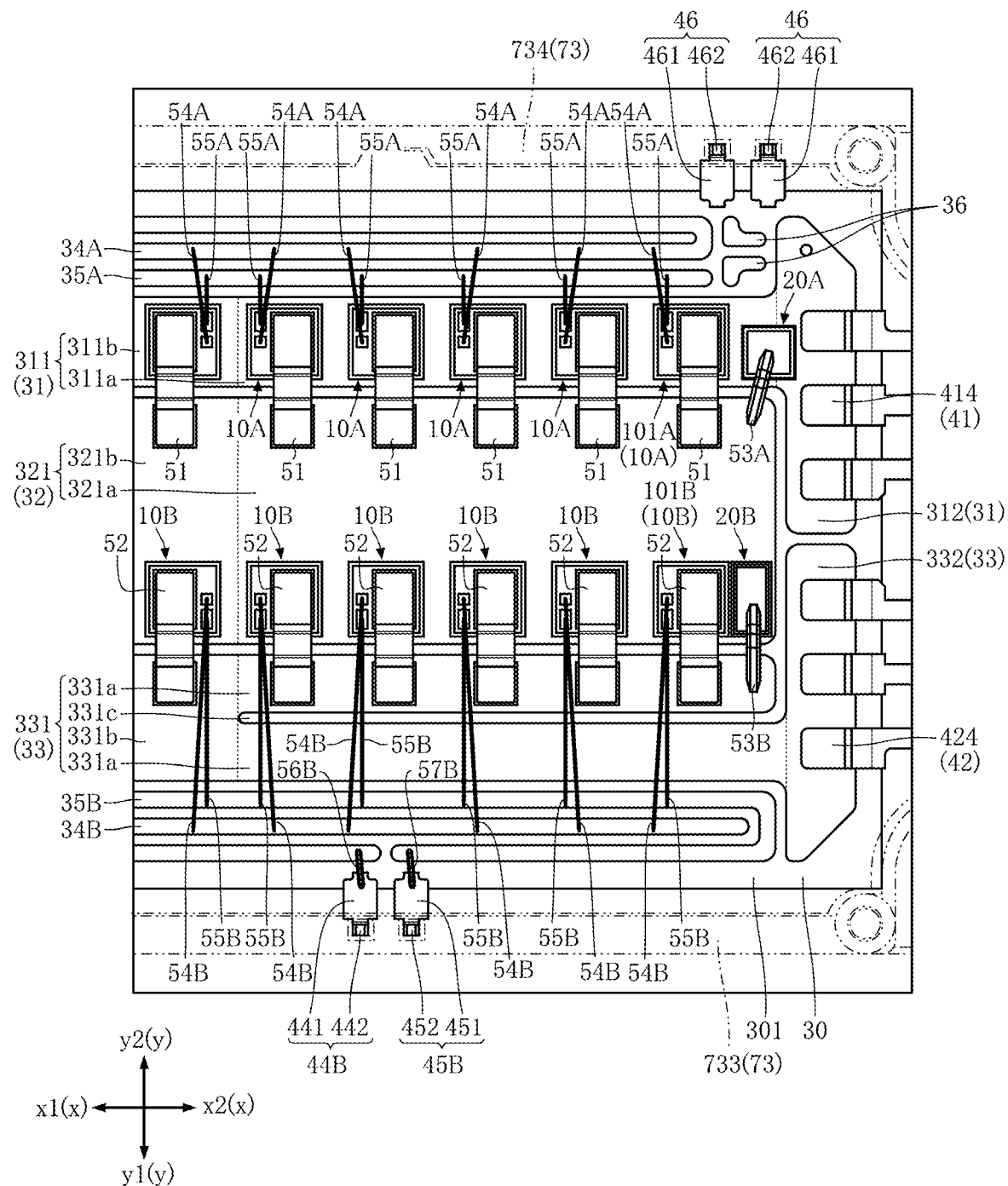
FIG. 5 is an enlarged view showing a portion of FIG. 4.
Figure 6:
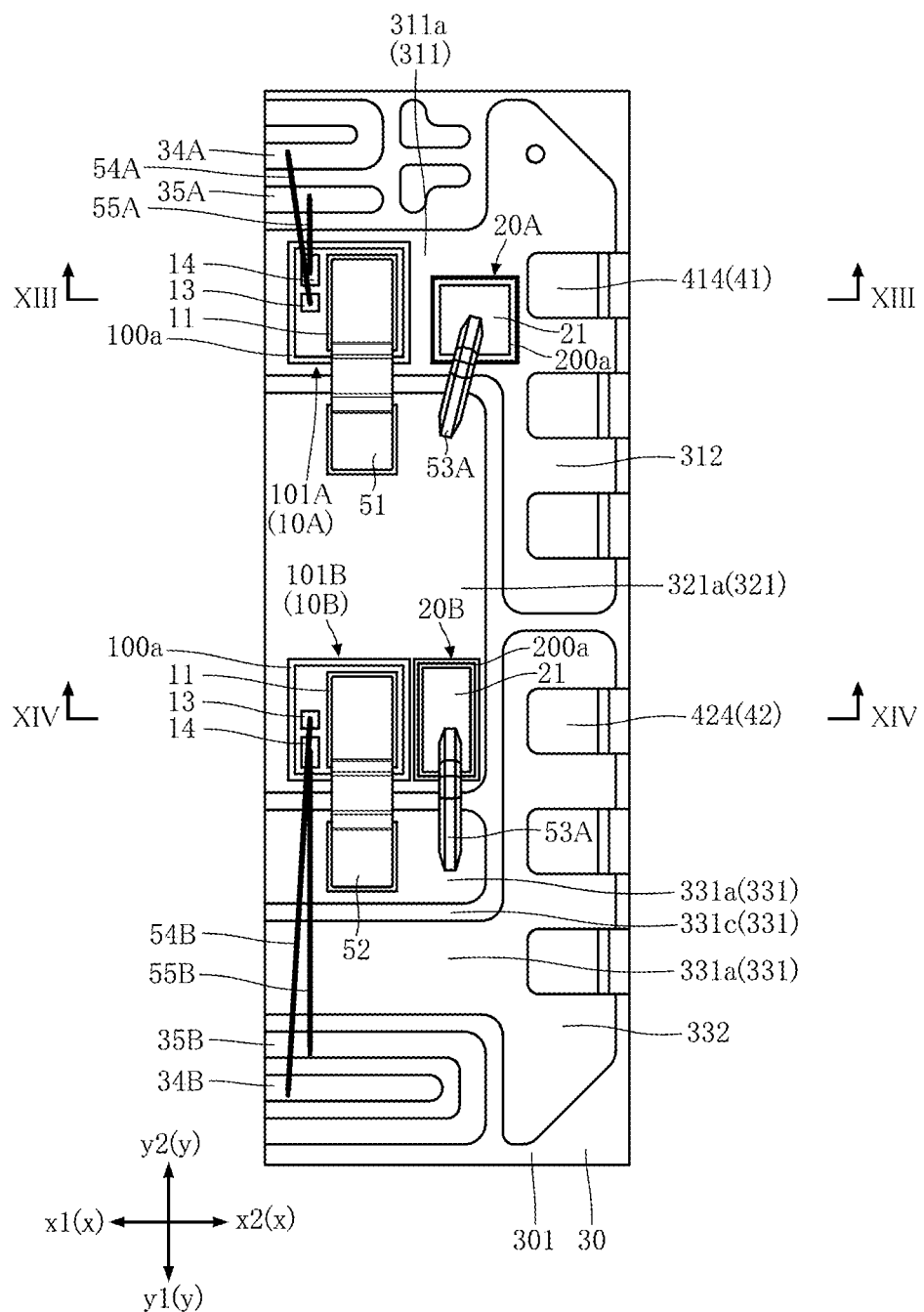
FIG. 6 is an enlarged view showing a portion of FIG. 5.
Figure 7:
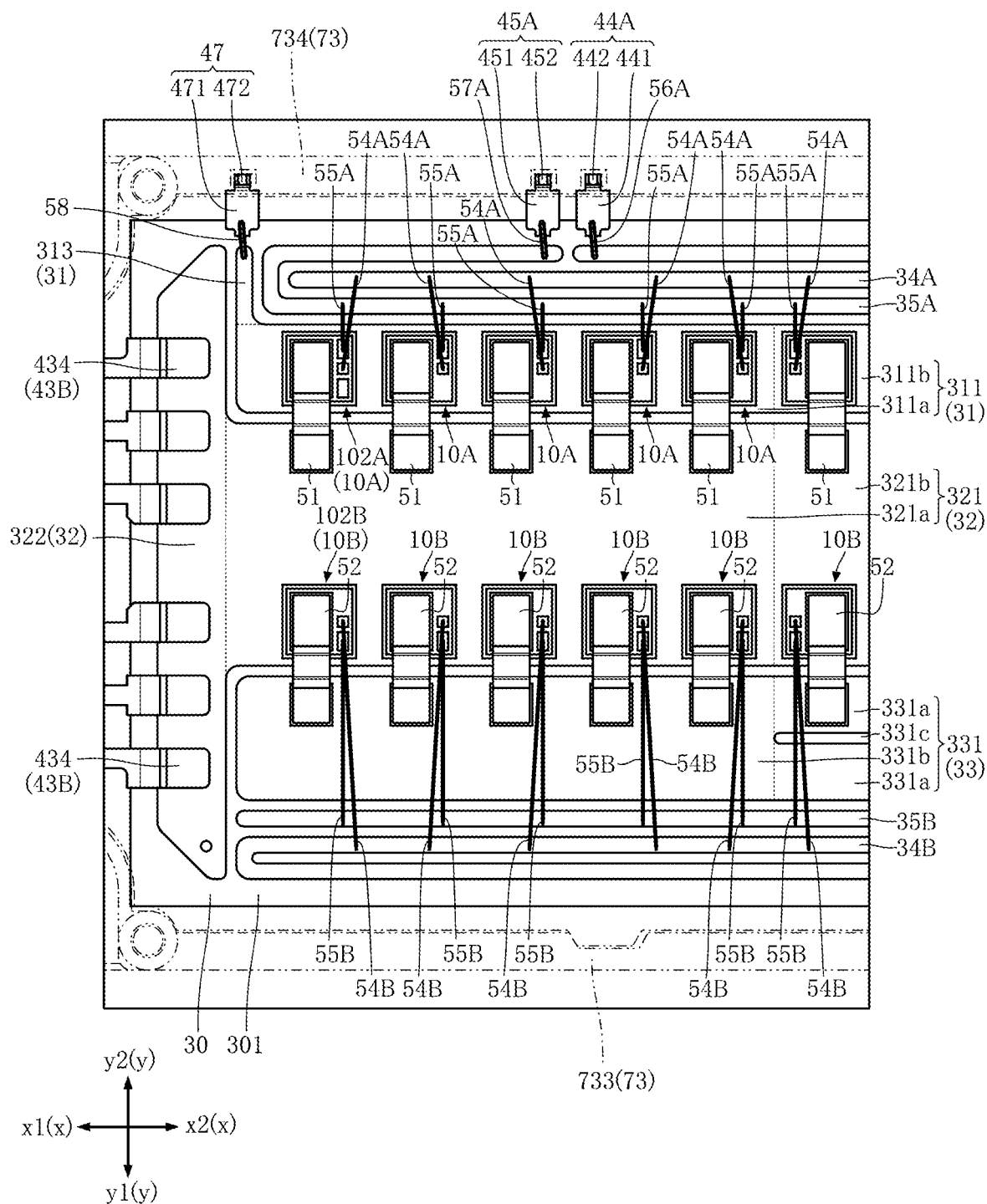
FIG. 7 is an enlarged view showing a portion of FIG. 4.
Figure 8:
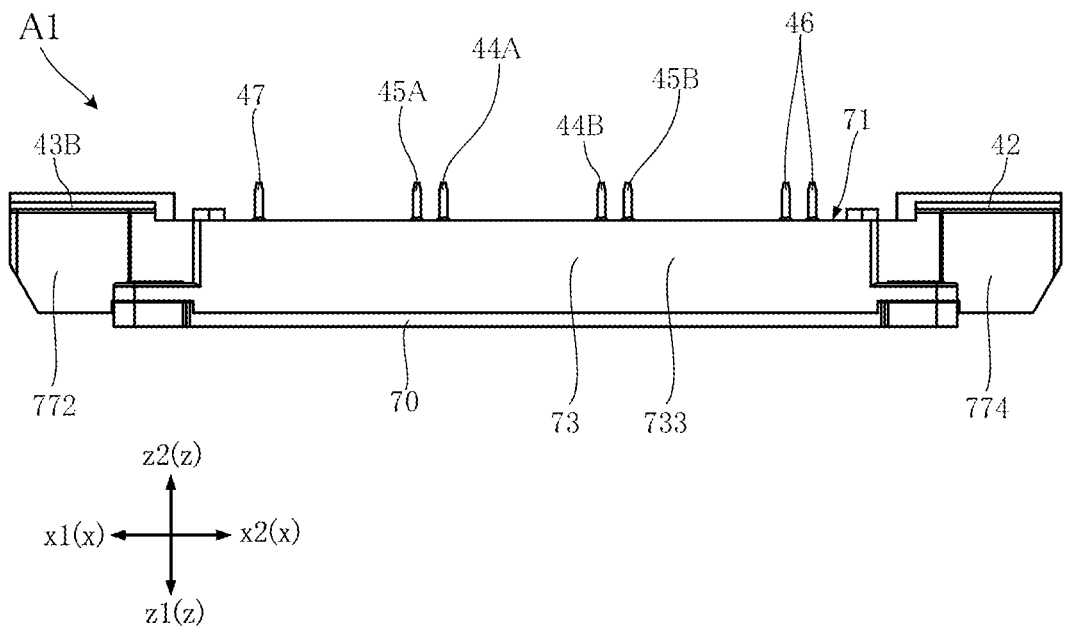
FIG. 8 is a front view of the semiconductor device according to the first embodiment.
Figure 9:
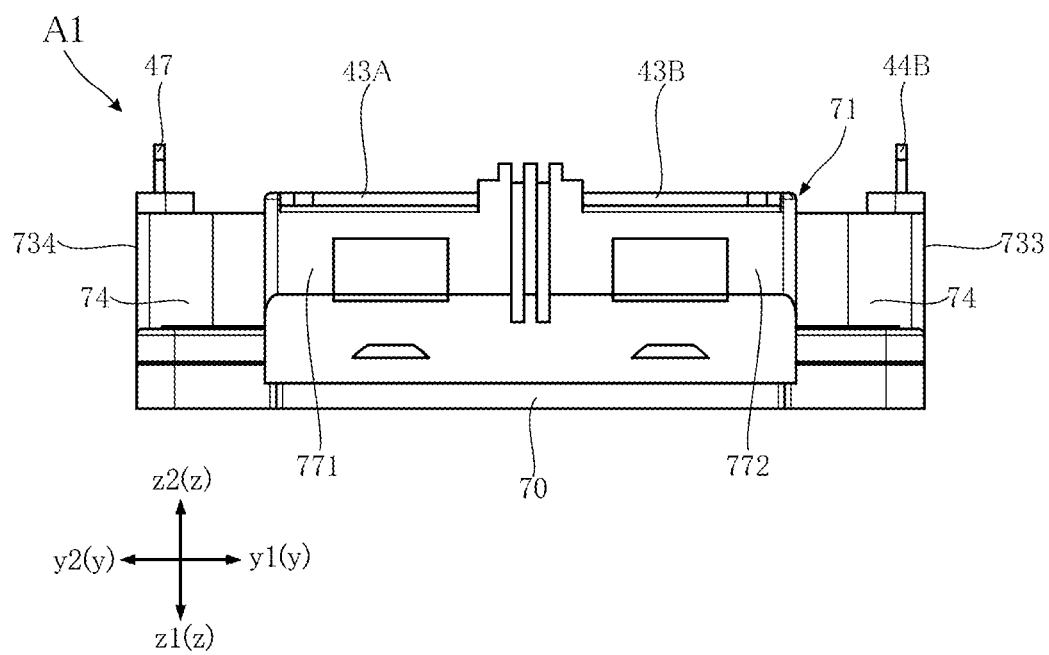
FIG. 9 is a side view (left side) of the semiconductor device according to the first embodiment.
Figure 10:
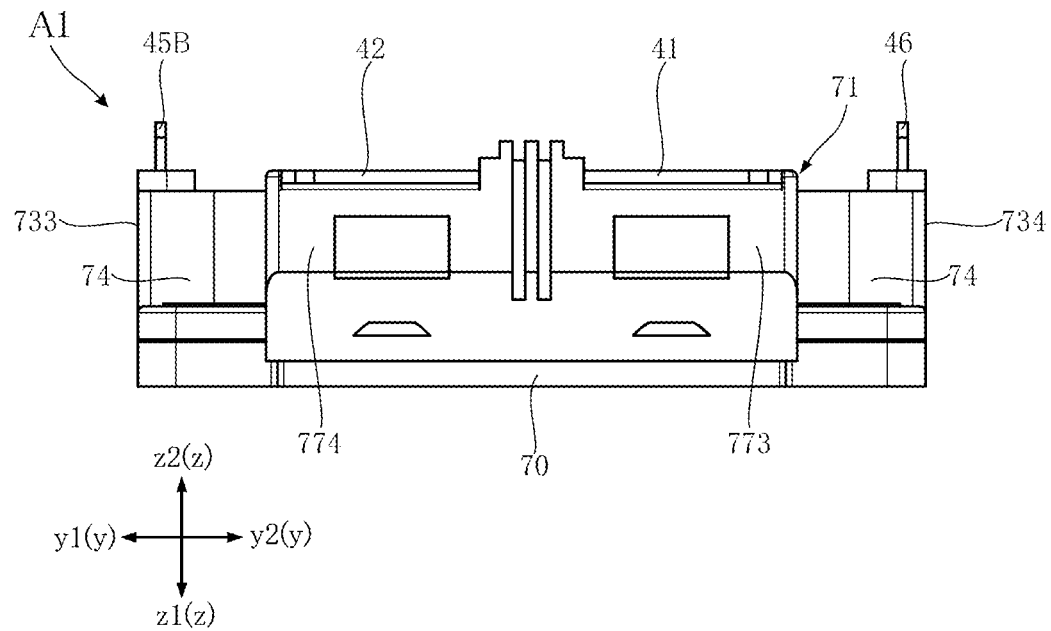
FIG. 10 is a side view (right side) of the semiconductor device according to the first embodiment.
Figure 11:
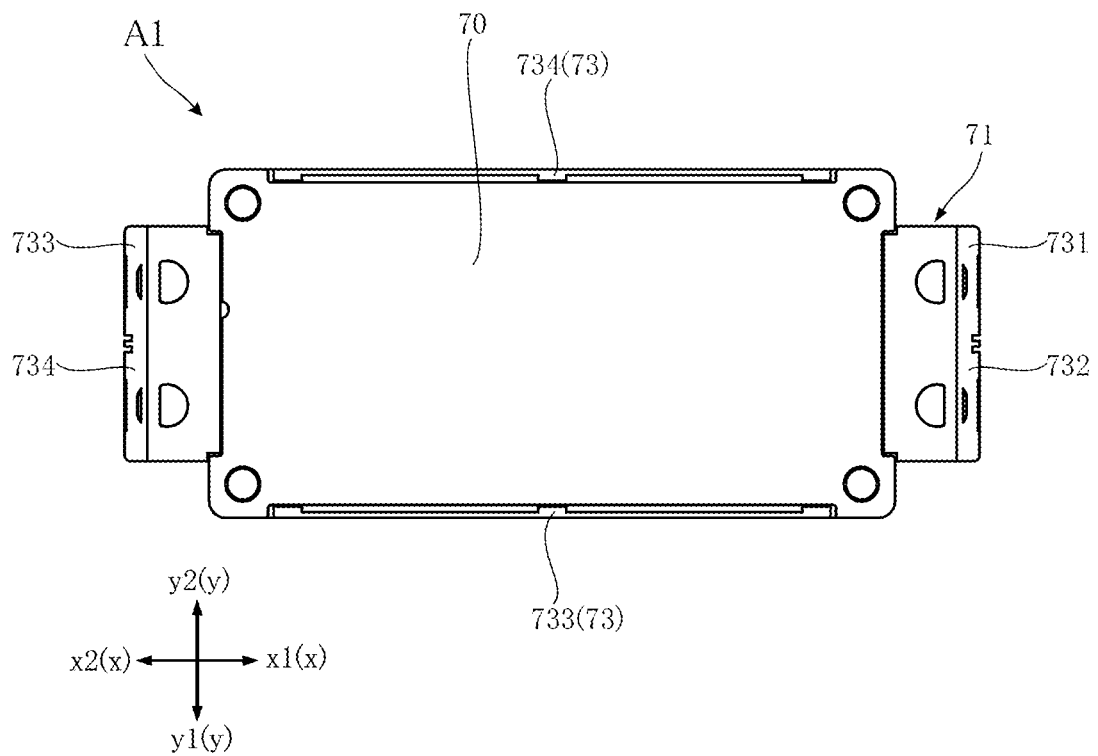
FIG. 11 is a bottom view of the semiconductor device according to the first embodiment.
Figure 12:
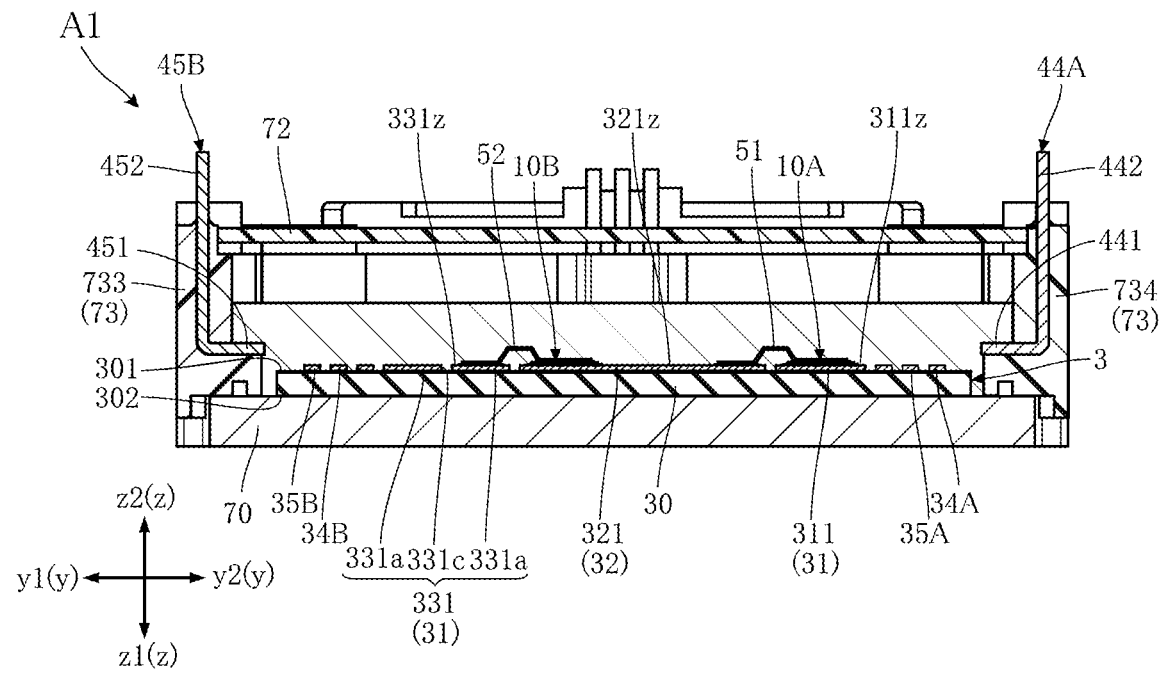
FIG. 12 is a sectional view taken along line XII-XII of FIG. 4.
Figure 13:
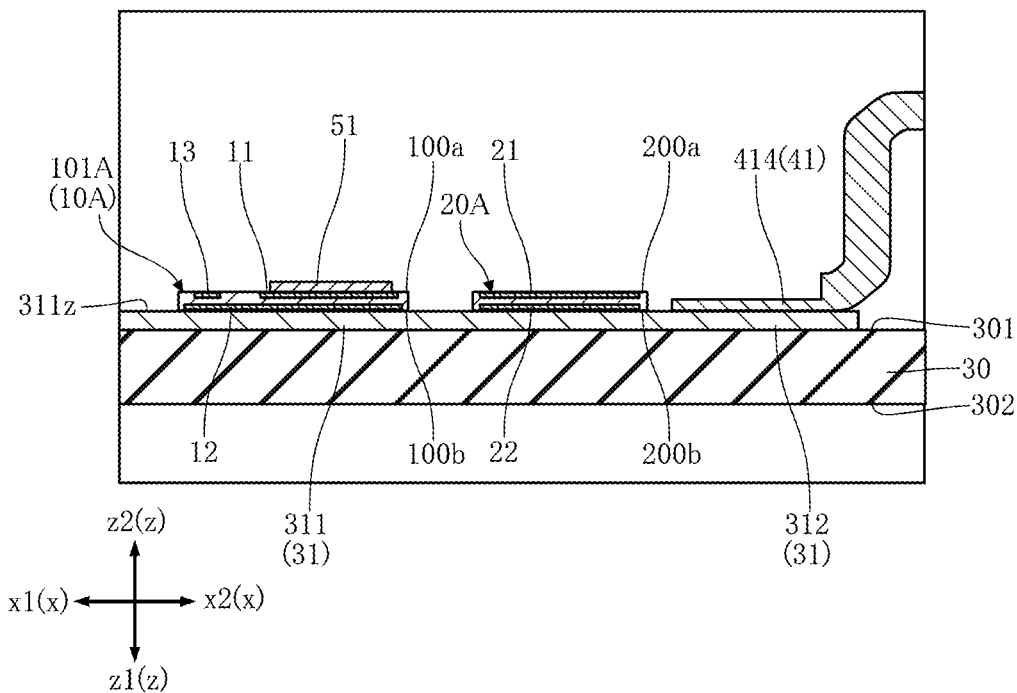
FIG. 13 is a sectional view taken along line XIII-XIII of FIG. 6.
Figure 14:
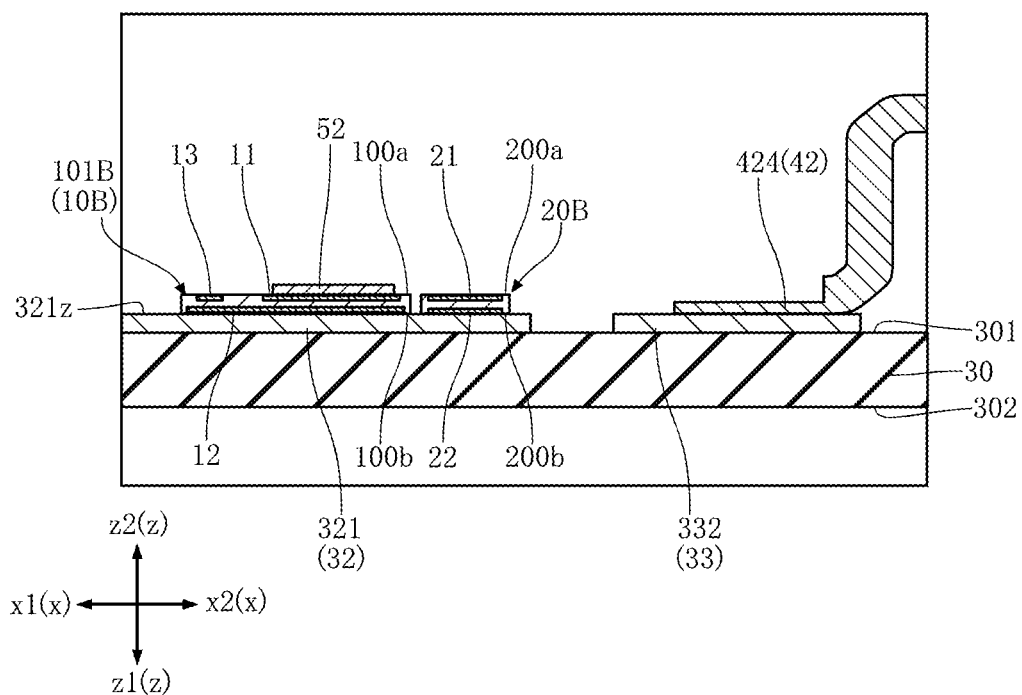
FIG. 14 is a sectional view taken along line XIV-XIV of FIG. 6.
Figure 15:
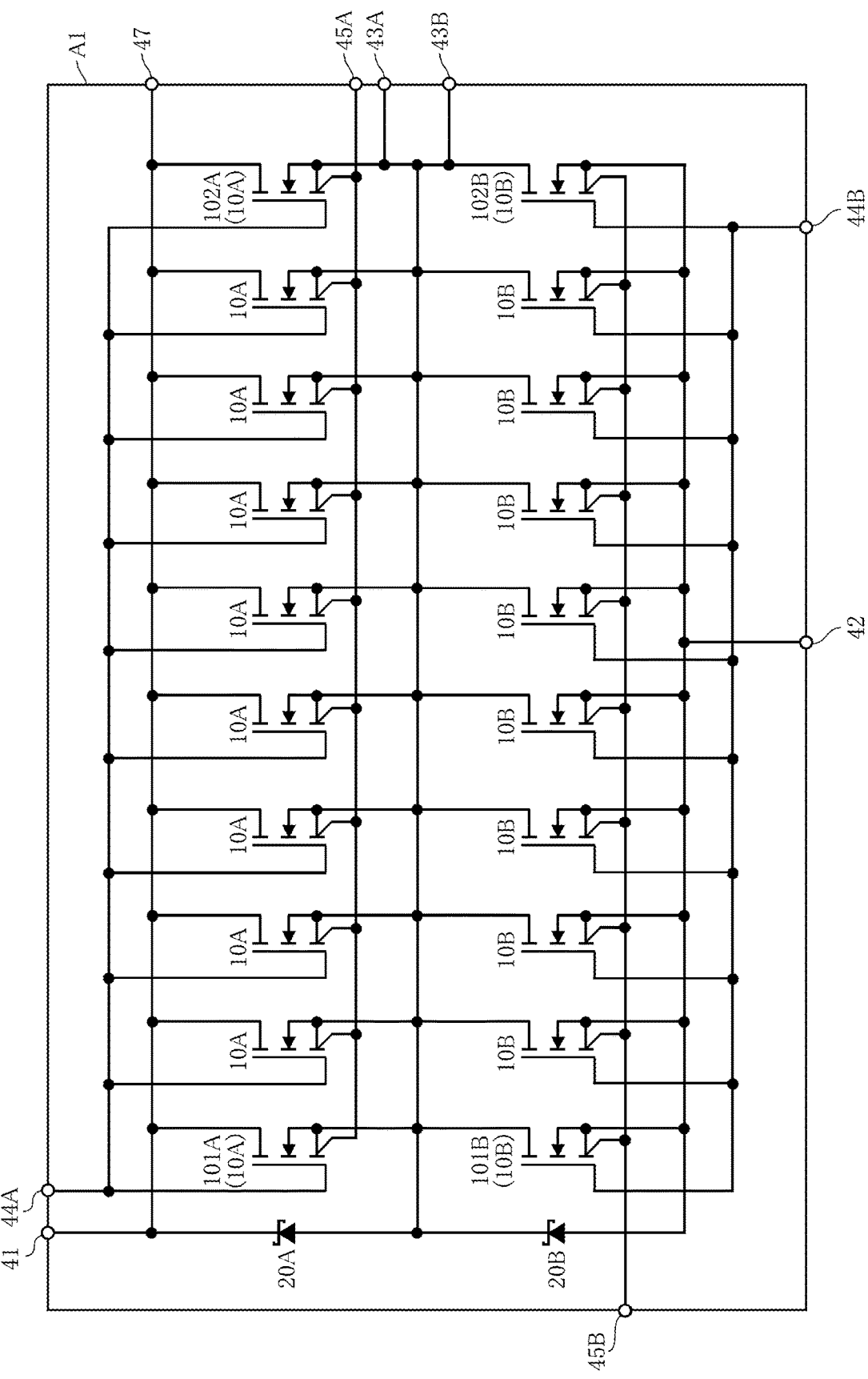
FIG. 15 is a circuit diagram showing an example of circuitry of the semiconductor device according to the first embodiment.

FIG. 1 is a perspective view of the semiconductor device A1. FIG. 2 is a perspective view similar to FIG. 1, with the heat-dissipating plate 70 and the casing 71 omitted. FIG. 3 is a plan view of the semiconductor device A1. FIG. 4 is a plan view similar to FIG. 3, with the heat-dissipating plate 70 and the casing 71 shown in phantom (chain double-dashed lines). FIG. 5 is an enlarged view showing a portion of FIG. 4. FIG. 6 is an enlarged view showing a portion of FIG. 5. FIG. 7 is an enlarged view showing a portion of FIG. 4. FIG. 8 is a front view of the semiconductor device A1. FIG. 9 is a side view (left side) of the semiconductor device A1. FIG. 10 is a side view (right side) of the semiconductor device A1. FIG. 11 is a bottom view of the semiconductor device A1. FIG. 12 is a sectional view taken along line XII-XII of FIG. 4. FIG. 13 is a sectional view taken along line XIII-XIII of FIG. 6. FIG. 14 is a sectional view taken along line XIV-XIV of FIG. 6. FIG. 15 is a circuit diagram showing an example of circuitry of the semiconductor device A1.

For purposes of explanation, three mutually perpendicular directions are defined as x, y and z directions. The z direction corresponds to the thickness direction of the semiconductor device A1. The x direction corresponds to the horizontal direction in plan view of the semiconductor device A1 (see FIGS. 3 and 4). The y direction corresponds to the vertical direction in plan view of the semiconductor device A1 (see FIGS. 3 and 4). In addition, one side in the x direction is defined as x1 direction, and the other side as x2 direction. One side in the y direction is defined as y1 direction, and the other side as y2 direction. One side in the z direction is defined as z1 direction, and the other side as z2 direction. In the description below, the term "plan view" refers to a view as viewed in the z direction. Although not limited, the z direction, x direction and y direction are respectively examples of the "thickness direction", "first direction" and "second direction" of the present disclosure.

As shown in FIGS. 11 and 12, the heat-dissipating plate 70 is a plate-like member having a rectangular shape in plan view. The heat-dissipating plate 70 is made of a high thermal conductive material, such as copper or a copper alloy. The heat-dissipating plate 70 may be plated with nickel. If necessary, a cooling element (e.g., heatsink) may be attached to the surface of the heat-dissipating plate 70 facing in the z1 direction. As shown in FIG. 12, the supporting member 3 is placed on the heat-dissipating plate 70.

The casing 71 roughly has the shape of a rectangular parallelepiped, as can be seen from FIGS. 1 and 3. The casing 71 is made from a synthetic resin that is electrically insulative and highly heat resistant, such as polyphenylene sulfide (PPS). In plan view, the casing 71 has substantially the same rectangular shape and size as the rectangular heat-dissipating plate 70. The casing 71 includes a frame 73 fixed to the surface of the heat-dissipating plate 70 facing in the z2 direction and a top plate 72 fixed to the frame 73. As shown in FIGS. 1 and 12, the top plate 72 closes the opening of the frame 73 at a side in the z2 direction. As shown in FIG. 12, the top plate 72 faces the heat-dissipating plate 70 that closes the frame 73 at a side in the z1 direction. Within the casing 71, the top plate 72, the heat-dissipating plate 70 and the frame 73 of the casing 71 define a circuit accommodating space (an internal space for accommodating the semiconductor elements 10A and 10B, the rectifier elements 20A and 20B, and the supporting member 3, and so on).

As shown in FIG. 3, the frame 73 includes a pair of side walls 731 and 732 spaced apart in the x direction and a pair of side walls 733 and 734 spaced apart in the y direction. The side walls 731 and 732 extend in the y direction in plan view. The side wall 732 is located in the x2 direction from the side wall 731. The side walls 733 and 734 extend in the x direction in plan view. The side wall 734 is located in the y2 direction from the side wall 733. The side wall 733 is connected to the ends of the side walls 731 and 732 in the y1 direction, whereas the side wall 734 is connected to the ends of the side walls 731 and 732 in the y2 direction.

The side wall 731 has an outer surface provided with two terminal mounts 771 and 772 as shown in FIGS. 1, 3 and 9. The two terminal mounts 771 and 772 are adjacent in the y direction. The terminal mount 771 covers a portion of the power terminal 43A and has a portion of the power terminal 43A located on the surface facing in the z2 direction. The terminal mount 772 covers a portion of the power terminal 43B and has a portion of the power terminal 43B located on the surface facing in the z2 direction. In plan view, the terminal mount 771 is located in the y2 direction from the longitudinal center (the center in the y direction) of the side wall 731, and the terminal mount 772 is located in the y1 direction from the longitudinal center (the center in the y direction) of the side wall 731. The terminal mounts 771 and 772 are integrally formed with the side wall 731.

The side wall 732 has an outer surface provided with two terminal mounts 773 and 774 as shown in FIGS. 1, 3 and 10. The two terminal mounts 773 and 774 are adjacent in the y direction. The terminal mount 773 covers a portion of the power terminal 41 and has a portion of the power terminal 41 located on the surface facing in the z2 direction. The terminal mount 774 covers a portion of the power terminal 42 and has a portion of the power terminal 42 located on the surface facing in the z2 direction. In plan view, the terminal mount 773 is located in the y2 direction from the longitudinal center (the center in the y direction) of the side wall 732, and the terminal mount 774 is located in the y1 direction from the longitudinal center (the center in the y direction) of the side wall 732. The terminal mounts 773 and 774 are integrally formed with the side wall 732. Each of the terminal mounts 771 to 774 may be provided with a nut embedded therein (not shown). The nut has a threaded hole with the central axis aligned in the z direction.

As shown in FIGS. 1, 3 and 8 to 10, each of the four corners of the frame 73 forms a recessed portion 74 on the surface facing in the z2 direction. The bottom wall of the recessed portion 74 has a mounting through-hole 75 formed therethrough, and tubular metal fixture 76 is securely fitted in the mounting through-hole 75. The heat-dissipating plate 70 is formed with mounting through-holes (see FIG. 11), each of which is aligned with a mounting through-hole 75. By inserting fasters (e.g., bolts) through the mounting through-holes 75 of the casing 71 and the mounting through-holes of the heat-dissipating plate 70, the semiconductor device A1 can be fixed to a predetermined position on a target. The mounting through-holes 75 may be used to attach a cooling means, such as a heatsink mentioned above.

The semiconductor elements 10A and 10B may be MOSFETs as shown in FIG. 15. Alternatively, the semiconductor elements 10A and 10B may be field-effect transistors such as metal-insulator-semiconductor FETs (MISFETs) or bipolar transistors such as IGBTs. Each of the semiconductor elements 10A and 10B includes a body diode not shown in the figures. The semiconductor elements 10A and 10B may be made from silicon carbide (SiC), for example. Alternatively, the semiconductor elements 10A and 10B may be made from silicon (Si), gallium arsenide (GaAs) or gallium nitride (GaN). In plan view, the semiconductor elements 10A and 10B have a rectangular shape, for example.

Each of the semiconductor elements 10A and 10B has an element obverse surface 100a and an element reverse surface 100b as shown in FIGS. 13 and 14. In each of the semiconductor elements 10A and 10B, the element obverse surface 100a and the element reverse surface 100b are spaced apart from each other in the z direction, with the element obverse surface 100a facing in the z2 direction and the element reverse surface 100b in the z1 direction.

Each of the semiconductor elements 10A and 10B includes a first electrode 11, a second electrode 12, a third electrode 13 and a fourth electrode 14, as shown in FIGS. 6, 13 and 14. In each of the semiconductor elements 10A and 10B, the first electrode 11, the third electrode 13 and the fourth electrode 14 are formed on the element obverse surface 100a, and the second electrode 12 is formed on the element reverse surface 100b. In the example in which the semiconductor elements 10A and 10B are MOSFETs, the first electrode 11 is a source electrode, the second electrode 12 is a drain electrode, the third electrode 13 is a gate electrode, and the fourth electrode 14 is a source-sensing electrode (source-current sensing electrode). In each of the semiconductor elements 10A and 10B, the anode of the body diode is connected to the first electrode 11 (the source electrode) and the cathode is connected to the second electrode 12 (the drain electrode). The semiconductor element 10A or 10B changes between a conducting state and a non-conducting state, in response to an input drive signal (for example, gate voltage) supplied to the third electrode 13 (gate electrode). This operation of a semiconductor element changing between the conducting state and the non-conducting state is referred to as a switching operation. During the conducting state, an electric current flows from the second electrode 12 (drain electrode) to the first electrode 11 (source electrode). During the non-conduction state, the drain-to-source current does not flow. Through the switching operations of the semiconductor elements 10A and 10B, the semiconductor device A1 converts DC voltage input across the two power terminals 41 and 42 to an AC voltage, for example.

The semiconductor device A1 may be a switching circuit in a half-bridge configuration, for example. In such an example, the semiconductor elements 10A form an upper arm circuit of the semiconductor device A1, and the semiconductor elements 10B form a lower arm circuit of the semiconductor device A1. Each semiconductor element 10A is serially connected to each semiconductor element 10B to form a bridge. In FIGS. 2, 4 and 15, the semiconductor device A1 includes ten semiconductor elements 10A and ten semiconductor elements 10B. The numbers of the semiconductor elements 10A and 10B are not limited to this example, and may be changed depending on the performance required for the semiconductor device A1.

The semiconductor elements 10A are mounted on the supporting member 3 as shown in FIGS. 4 to 7, 12 and 13. In the example shown in FIG. 4, the semiconductor elements 10A are spaced side by side in the x direction, for example. The semiconductor elements 10A are electrically bonded to the supporting member 3 (an electrical conductor 31 described later) via an electrically conductive bonding material (e.g., sintered metal, such as sintered silver or sintered copper, metal paste, such as silver paste or copper paste, or solder) not shown in the figures. Each semiconductor element 10A is bonded to the electrical conductor 31 with the element reverse surface 100b facing the electrical conductor 31.

The semiconductor elements 10A include a first element 101A and a second element 102A as shown in FIGS. 4 to 7. The first element 101A and the second element 102A differ from each other in the lengths of their minimum conduction paths to the power terminal 41. The minimum conduction path of the first element 101A is shorter than the minimum conduction path of the second element 102A. In the illustrated semiconductor device A1, the first element 101A is the one, among the semiconductor elements 10A, that has the shortest minimum conduction path to the power terminal 41, whereas the second element 102A is the one, among the semiconductor elements 10A, that has the longest minimum conduction path to the power terminal 41. In an alternative example, any two semiconductor elements 10A may be selected, with one of them being as a first element 101A having a relatively short minimum conduction path to the power terminal 41 and the other as being a second element 102A having a relatively long minimum conduction path to the power terminal 41, differing from the illustrated case where the first element 101A is the semiconductor element 10A having the shortest minimum conduction path to the power terminal 41 and the second element 102A is the semiconductor element 10A having the longest minimum conduction path to the power terminal 41.

The semiconductor elements 10B are mounted on the supporting member 3 as shown in FIGS. 4 to 7, 12 and 14. In the example shown in FIG. 4, the semiconductor elements 10B are spaced side by side in the x direction, for example. The semiconductor elements 10B are electrically bonded to the supporting member 3 (the electrical conductor 32 described later) via an electrically conductive bonding material (e.g., sintered metal, such as sintered silver or sintered copper, metal paste, such as silver paste or copper paste, or solder) not shown in the figures. Each semiconductor element 10B is bonded to the electrical conductor 32 with the element reverse surface 100b facing the electrical conductor 32. In the example shown in FIGS. 4 and 5, the semiconductor elements 10A overlap with the semiconductor elements 10B as viewed in the y direction. In another example, the semiconductor elements 10A and 10B may be arranged so as not to overlap with each other.

The semiconductor elements 10B include a third element 101B and a fourth element 102B as shown in FIGS. 4 to 7. The third element 101B and the fourth element 102B differ from each other in the lengths of their minimum conduction paths to the power terminal 41. The minimum conduction path of the fourth element 102B is shorter than the minimum conduction path of the third element 101B. In the illustrated semiconductor device A1, the third element 101B is the one, among the semiconductor elements 10B, that has the shortest minimum conduction path to the power terminal 41, whereas the fourth element 102B is the one, among the semiconductor elements 10B, that has the longest minimum conduction path to the power terminal 41. In an alternative example, any two semiconductor elements 100B may be selected, with one of them being as a third element 101B having a relatively short minimum conduction path to the power terminal 41 and the other as being a fourth element 102B having a relatively long minimum conduction path to the power terminal 41, differing from the illustrated case where the third element 101B is the semiconductor element 10B having the shortest minimum conduction path to the power terminal 41 and the fourth element 102B is the semiconductor element 10B having the longest minimum conduction path to the power terminal 41.

Each of the rectifier elements 20A and 20B may be a diode. In an example in which the semiconductor elements 10A and 10B are implemented by MOSFETs, Schottky barrier diodes may be used as the rectifier elements 20A and 20B as shown in FIG. 15. In an example in which the semiconductor elements 10A and 10B are IGBTs, fast recovery diodes may be used. In a yet another example, the rectifier elements 20A and 20B are not limited to diodes, and any electronic component capable of rectification may be used. For example, transistors configured to be switched in synchronism with the switching operations of the corresponding semiconductor elements 10A and 10B may be used.

Each of the semiconductor elements 20A and 20B has an element obverse surface 200a and an element reverse surface 200b as shown in FIGS. 13 and 14. In each of the rectifier elements semiconductor elements 20A and 20B, the element obverse surface 200a and the element reverse surface 200b are spaced apart from each other in the z direction, with the element obverse surface 200a facing in the z2 direction and the element reverse surface 200b in the z1 direction.

Each of the rectifier elements 20A and 20B includes a first electrode 21 and a second electrode 22 as shown in FIGS. 13 and 14. The first electrode 21 is formed on the element obverse surface 200a, whereas the second electrode 22 is formed on the element reverse surface 200b. In an example in which the rectifier elements 20A and 20B are diodes (e.g., Schottky barrier diodes), the first electrode 21 is an anode and the second electrode 22 is a cathode.

As shown in FIG. 15, the rectifier element 20A is electrically connected to the semiconductor elements 10A in anti-parallel arrangement. The anti-parallel connection means that the rectifier element 20A is connected in parallel to each semiconductor element 10A, with their forward currents flowing in opposite directions. Specifically, the first electrode 21 (anode) of the rectifier element 20A is connected to the first electrode 11 (source electrode) of each semiconductor element 10A, whereas the second electrode 22 (cathode) of the rectifier element 20A is connected to the second electrode 12 (drain electrode) of each semiconductor elements 10A. Hence, the first electrode 21 (anode) of the rectifier element 20A is electrically connected to the first electrodes 11 (source electrodes) of the semiconductor elements 10A, whereas the second electrode 22 (cathode) of the rectifier element 20A is electrically connected to the second electrodes 12 (drain electrodes) of the semiconductor elements 10A. When a surge voltage is generated during switching operations of the semiconductor elements 10A, the rectifier element 20A will conduct the forward current (surge current), thereby suppressing the surge voltage otherwise applied across the semiconductor elements 10A. In the example shown in FIG. 4, the rectifier element 20A is adjacent to the first element 101A. Although the semiconductor device A1 is provided with a single rectifier element 20A, the semiconductor device A1 may be provided with more than one rectifier elements 20A but fewer than the semiconductor elements 10A.

As shown in FIG. 15, the rectifier element 20B is electrically connected to the semiconductor elements 10B in anti-parallel arrangement. The anti-parallel connection means that the rectifier element 20B is connected in parallel to each semiconductor element 10B, with their forward currents flowing in opposite directions. Specifically, the first electrode 21 (anode) of the rectifier element 20B is connected to the first electrode 11 (source electrode) of each semiconductor element 10B, whereas the second electrode 22 (cathode) of the rectifier element 20B is connected to the second electrode 12 (drain electrode) of each semiconductor elements 10B. Hence, the first electrode 21 (anode) of the rectifier element 20B is electrically connected to the first electrodes 11 (source electrodes) of each semiconductor elements 10B, whereas the second electrode 22 (cathode) of the rectifier element 20B is electrically connected to the second electrodes 12 (drain electrodes) of the semiconductor elements 10B. When a surge voltage is generated during switching operations of the semiconductor elements 10B, the rectifier element 20B will conduct the forward current (surge current), thereby suppressing the surge voltage otherwise applied across the semiconductor elements 10B. In the example shown in FIG. 4, the rectifier element 20B is adjacent to the third element 101B. Although the semiconductor device A1 is provided with a single rectifier element 20B, the semiconductor device A1 may be provided with more than one rectifier elements 20B but fewer than the semiconductor elements 10B.

The supporting member 3 supports the semiconductor elements 10A and 10B and the rectifier elements 20A and 20B. The supporting member 3 provides conduction paths connecting the semiconductor elements 10A and 10B and the rectifier elements 20A and 20B with the power terminals 41, 42, 43A, 43B, the signal terminals 44A and 44B, and the sensing terminals 45A, 45B, 46 and 47. The supporting member 3 includes an insulating substrate 30, a plurality of electrical conductors 31 to 33, a pair of electrical conductors 34A and 34B, a pair of electrical conductors 35A and 35B, and a pair of electrical conductors 36.

The insulating substrate 30 is electrically insulating. The insulating substrate 30 may be made of a high thermal conductive ceramic material, including aluminum nitride (AlN), silicon nitride (SiN) and aluminum oxide ($Al_2O_3$). The insulating substrate 30 may be in the shape of a flat plate, for example.

The insulating substrate 30 has an obverse surface 301 and a reverse surface 302 as shown in FIGS. 12 to 14. The obverse surface 301 and the reverse surface 302 are spaced apart from each other in the z direction, with the obverse surface 301 facing in the z2 direction and the reverse surface 302 in the z1 direction.

As shown in FIGS. 4 and 12, the electrical conductors 31 to 33, the pair of electrical conductors 34A and 34B, the pair of electrical conductors 35A and 35B and the pair of electrical conductors 36 are disposed on the obverse surface 301 of the insulating substrates 30. The electrical conductors 31 to 33, the pair of electrical conductors 34A and 34B, the pair of electrical conductors 35A and 35B and the pair of electrical conductors 36 are provided in the form of metal layers, for example. The electrical conductors 31 to 33, the pair of electrical conductors 34A and 34B, the pair of electrical conductors 35A and 35B and the pair of electrical conductors 36 are made of copper or a copper alloy, for example. In another example, the electrical conductors 31 to 33, the pair of electrical conductors 34A and 34B, the pair of electrical conductors 35A and 35B and the pair of electrical conductors 36 may be made of aluminum or an aluminum alloy, instead of copper or a copper alloy. The electrical conductors 31 to 33, the pair of electrical conductors 34A and 34B, the pair of electrical conductors 35A and 35B and the pair of electrical conductors 36 are spaced apart from each other.

The electrical conductor 31 is where the semiconductor elements 10A are mounted. The electrical conductor 31 is electrically connected to the power terminal 41. The electrical conductor 31 includes a first pad portion 311, a first bonding portion 312 and an extended portion 313. The first pad portion 311, the first bonding portion 312 and the extended portion 313 are integrally formed and hence connected to each other.

The first pad portion 311 is where the semiconductor elements 10A are bonded and electrically connected to the second electrodes 12 (drain electrodes) of the semiconductor elements 10A. The first pad portion 311 extends from the first bonding portion 312 in the x direction. In the example shown particularly in FIG. 4, the first pad portion 311 has the shape of a band longitudinally extending in the x direction. The semiconductor elements 10A on the first pad portion 311 are arranged side by side in the x direction. As shown in FIGS. 4, 12 and 13, the first pad portion 311 has a first bonding surface 311z. The first bonding surface 311z faces in the z2 direction and is substantially parallel to the x-y plane. The semiconductor elements 10A are bonded to the first bonding surface 311z.

The first pad portion 311 includes a first section 311a and a second section 311b. The first section 311a and the second section 311b are connected to each other. At least the first element 101A is bonded to the first section 311a. In the example shown in FIGS. 4 to 7, five of the semiconductor elements 10A (including the first element 101A) are bonded to the first section 311a, where the five semiconductor elements 10A have relatively short minimum conduction paths to the power terminal 41. The rectifier element 20A is also bonded to the first section 311a. In the example shown in FIG. 5, the rectifier element 20A is bonded across the first section 311a and the first bonding portion 312. At least the second element 102A is bonded to the second section 311b. In the example shown in FIGS. 4 to 7, five of the semiconductor elements 10A (including the second element 102A) are bonded to the second section 311b, where the five semiconductor elements 10A have relatively long minimum conduction paths to the power terminal 41. The rectifier element 20A is not bonded to the second section 311b. In the example shown in FIG. 4, the first section 311a and the second section 311b are determined by dividing the region of the first pad portion 311 into two approximately equal halves. The region closer to the power terminal 41 in the x direction is the first section 311a, and the region farther away from the power terminal 41 in the x direction is the second section 311b. When an odd number of semiconductor elements 10A are bonded to the first pad portion 311, the middle one of the semiconductor elements 10A in the x direction may be bonded to either the first section 311a or the second section 311b. Alternatively to the example shown in FIG. 4, the first section 311a and the second section 311b may be determined as follows. Two semiconductor elements 10A having different lengths of minimum conduction paths to the power terminal 41 are chosen, and then a section to which the semiconductor element 10A with the shorter minimum conduction path is bonded is designated as the first section 311a, and the remaining section, to which the other semiconductor element 10A with the longer minimum conduction path is bonded, is designated as the second section 311b. Alternatively, a section may be designated as the first section 311a when particular semiconductor elements 10A of all the elements 10A are bonded to this section, while the remaining section may be designated as the second section 311b, where the particular semiconductor elements satisfy the following condition: each of the particular semiconductor elements has a minimum conduction path to the power terminal 41, the length of which is smaller than the average length of the minimum conduction paths of all the semiconductor elements. The first bonding surface 311z is formed by the upper surfaces (surface facing in the z2 direction) of the first section 311a and the second section 311b.

As shown particularly in FIGS. 4 to 6, the power terminal 41 is bonded to the first bonding portion 312. The first bonding portion 312 has the shape of a band longitudinally extending in the y direction. The first bonding portion 312 is connected to the end of the first pad portion 311 in the x2 direction. Hence, the first element 101A is the one located farthest in the x2 direction among the plurality semiconductor elements 10A. On the other hand, the second element 102A is the one located farthest in the x1 direction among the plurality of semiconductor elements 10A.

As shown in FIG. 7, the extended portion 313 extends in the y direction from the end of the first pad portion 311 in the x1 direction. In the example shown in FIG. 7, the extended portion 313 is located between the electrical conductor 32 (a later-described second bonding portion 322) and the electrical conductors 34A and 35A in plan view.

The electrical conductor 32 is where the semiconductor elements 10B are mounted. The electrical conductor 32 is electrically connected to the power terminals 43A and 43B. The electrical conductor 32 includes a second pad portion 321 and a second bonding portion 322. The second pad portion 321 and the second bonding portion 322 are integrally formed and hence connected to each other.

The second pad portion 321 is where the semiconductor elements 10B are bonded and electrically connected to the second electrodes 12 (drain electrodes) of the semiconductor elements 10B. Additionally, the connecting members 51 are bonded to the second pad portion 321 to electrically connect the second pad portion 321 to the first electrodes 11 (source electrodes) of the semiconductor elements 10A. The second pad portion 321 extends from the second bonding portion 322 in the x direction. In the example shown particularly in FIG. 4, the second pad portion 321 has the shape of a band longitudinally extending in the x direction. The semiconductor elements 10B on the second pad portion 321 are arranged side by side in the x direction. As shown in FIGS. 4, 12 and 14, the second pad portion 321 has a second bonding surface 321z. The second bonding surface 321z faces in the z2 direction and is substantially parallel to the x-y plane. The semiconductor elements 10B are bonded to the second bonding surface 321z.

The second pad portion 321 includes a third section 321a and a fourth section 321b. The third section 321a and the fourth section 321b are connected to each other. At least the third element 101B is bonded to the third section 321a. In the example shown in FIGS. 4 to 7, five of the semiconductor elements 10B (including the third element 101B) are bonded to the third section 321a, where the five semiconductor elements 10B have relatively short minimum conduction paths to the power terminal 41. The rectifier element 20B is also bonded to the third section 321a. In plan view, the rectifier element 20B is located between the third element 101B and the end of the third section 321a closer to the power terminal 41 in the x direction. At least the fourth element 102B is bonded to the fourth section 321b. In the example shown in FIGS. 4 to 7, five of the semiconductor elements 10B are bonded to the fourth section 321b, where the five semiconductor elements 10B (including the fourth element 102BI have relatively long minimum conduction paths to the power terminal 41. The rectifier element 20B is not bonded to the fourth section 321b. In the example shown in FIG. 4, the third section 321a and the fourth section 321b are determined by dividing the region of the second pad portion 321 into two approximately equal halves. The region closer to the power terminal 41 in the x direction is designated as the third section 321a, and the region farther away from the power terminal 41 in the x direction is designated as the fourth section 321b. When an odd number of semiconductor elements 10B are bonded to the second pad portion 321, the middle one of the semiconductor elements 10B in the x direction may be bonded to either the third section 321a or the fourth section 321b. Alternatively to the example shown in FIG. 4, the third section 321a and the fourth section 321b may be determined as follows. Two semiconductor elements 10B having different lengths of minimum conduction paths to the power terminal 41 are chosen, and then a section to which the semiconductor element 10B with the shorter minimum conduction path is bonded is designated as the third section 321a, and the remaining section, to which the other semiconductor element 10B with the longer minimum conduction path is bonded, is designated as the fourth section 321b. Alternatively, a section may be designated as the third section 321a when particular semiconductor elements 10B of all the elements 10B are bonded to this section, while the remaining section may be designated as the fourth section 321b, where the particular semiconductor elements satisfy the following condition: each of the particular semiconductor elements has a minimum conduction path to the power terminal 41, the length of which is smaller than the average length of the minimum conduction paths of all the semiconductor elements. The second bonding surface 321z is formed by the upper surfaces (surface facing in the z2 direction) of the third section 321a and the fourth section 321b.

As shown in FIGS. 4 and 7, the pair of power terminals 43A and 43B are bonded to the second bonding portion 322. The second bonding portion 322 has the shape of a band longitudinally extending in the y direction. The second bonding portion 322 is connected to the end of the second pad portion 321 in the x1 direction.

The electrical conductor 33 is electrically connected to the power terminal 42. As shown in FIG. 4, the electrical conductor 33 includes a third pad portion 331 and a third bonding portion 332. The third pad portion 331 and the third bonding portion 332 are integrally formed and hence connected to each other.

The connecting members 52 are bonded to the third pad portion 331. The third pad portion 331 is therefore electrically connected to the first electrodes 11 (source electrodes) of the semiconductor elements 10B via the connecting members 52. The third pad portion 331 extends from the third bonding portion 332 in the x direction. In the example shown in FIG. 4, the third pad portion 331 has the shape of a band longitudinally extending in the x direction. As shown in FIGS. 4 and 12, the third pad portion 331 has a third bonding surface 331z. The third bonding surface 331z faces in the z2 direction and is substantially parallel to the x-y plane. The connecting members 52 are bonded to the third bonding surface 331z.

As shown in FIGS. 5 to 7, the third pad portion 331 includes a pair of branched portions 331a, a connecting portion 331b and a slit 331c. The branched portions 331a are separated in the y direction by the slit 331c. One of the branched portions 331a is where a subset of connecting members 52 are bonded, and the other of the branched portions 331a is connected to the third bonding portion 332. The branched portions 331a overlap with the first section 311a and the third section 321a as viewed in the y direction. That is, the slit 331c also overlaps with the first section 311a and the third section 321a as viewed in the y direction. The connecting portion 331b is connected to each of the branched portions 331a and thus connecting the branched portions 331a together. The connecting portion 331b is where a subset of connecting members 52 are bonded. The third bonding surface 331z is formed by the upper surfaces (surface facing in the z2 direction) of the pair of branched portions 331a and the connecting portion 331b.

As shown in FIGS. 5 and 6, the power terminal 42 is bonded to the third bonding portion 332. The third bonding portion 332 has the shape of a band longitudinally extending in the y direction. The third bonding portion 332 is connected to the end of the third pad portion 331 in the x2 direction. More specifically, the third bonding portion 332 is connected to one of the branched portions 331a (in the example shown in FIG. 5, the one located in the y1 direction) of the third pad portion 331.

The pair of electrical conductors 34A and 34B are electrically connected to the third electrodes 13 (gate electrodes) of the semiconductor elements 10A and 10B. As shown in FIGS. 5 to 7, the electrical conductor 34A is electrically connected to the third electrode 13 (gate electrode) of each semiconductor element 10A via a connecting member 54A. As shown in FIGS. 5 to 7, the electrical conductor 34B is electrically connected to the third electrode 13 (gate electrode) of each semiconductor element 10B via a connecting member 54B.

The pair of electrical conductors 35A and 35B are electrically connected to the fourth electrodes 14 (source-sensing electrodes) of the semiconductor elements 10A and 10B. As shown in FIGS. 5 to 7, the electrical conductor 35A is electrically connected to the fourth electrode 14 (source-sensing electrode) of each semiconductor element 10A via a connecting member 55A. As shown in FIGS. 5 to 7, the electrical conductor 35B is electrically connected to the fourth electrode 14 (source-sensing electrode) of each semiconductor element 10B via a connecting member 55B.

In the example shown in FIGS. 4 to 6, the pair of electrical conductors 36 are not connected to any component. In a different example of the semiconductor device A1, a thermistor (not shown) may be connected to the pair of electrical conductors 36. The thermistor is connected across the pair of electrical conductors 36.

The power terminals 41, 42, 43A and 43B, the pair of signal terminals 44A and 44B, the sensing terminals 45A, 45B, 46 and 47 have portions exposed from the casing 71.

The two power terminals 41 and 42 are connected to a power source for applying a supply voltage (for example, DC voltage) across the power terminals 41 and 42. In one example, the power terminal 41 is a positive electrode (P terminal), and the power terminal 42 is a negative electrode (N terminal). The two power terminals 41 and 42 are spaced side by side in the y direction. The semiconductor elements 10A, as well as the semiconductor elements 10B, are arranged side by side in a direction (x direction) perpendicular to the direction in which the power terminals 41 and 42 are arranged (y direction).

As shown in FIG. 15, the power terminal 41 is electrically connected to the semiconductor elements 10A. As shown in FIGS. 2 and 4, the power terminal 41 includes an end portion 411, a base portion 412 and a standing portion 413. The end portion 411 is formed along the surface of the terminal mount 773 facing in the z2 direction. The base portion 412 is located in the z1 direction from the end portion 411 and is parallel to the end portion 411. The standing portion 413 connects the end portion 411 and the base portion 412 at their ends in the y1 direction. The standing portion 413 and most of the base portion 412 are enclosed within a space defined by the side wall 732 and the terminal mount 773. The base portion 412 has a comb-like portion 414 at the end in the x2 direction, with prongs extending inwardly of the casing 71. As shown in FIGS. 4 to 6, the comb-like portion 414 is bonded to the first bonding portion 312 of the electrical conductor 31. A variety of bonding methods may be used for this bonding, including bonding by using an electrically bonding material (such as solder or sintered metal), laser bonding, or ultrasonic bonding. By this bonding, the power terminal 41 is electrically connected via the electrical conductor 31 to the semiconductor elements 10A.

As shown in FIG. 15, the power terminal 42 is electrically connected to the semiconductor elements 10B. As shown in FIGS. 2 and 4, the power terminal 42 includes an end portion 421, a base portion 422 and a standing portion 423. The end portion 421 is formed along the surface of the terminal mount 774 facing in the z2 direction. The base portion 422 is located in the z1 direction from the end portion 421 and is parallel to the end portion 421. The standing portion 423 connects the end portion 411 and the base portion 422 at their ends in the y2 direction. The standing portion 423 and most of the base portion 422 are enclosed within a space defined by the side wall 732 and the terminal mount 774. The base portion 422 has a comb-like portion 424 at the end in the x2 direction, with prongs extending inwardly of the casing 71. As shown in FIGS. 4 to 6, the comb-like portion 424 is bonded to the third bonding portion 332 of the electrical conductor 33. A variety of bonding methods may be used for this bonding, including bonding by using an electrically bonding material (such as solder or sintered metal), laser bonding, or ultrasonic bonding. By this bonding, the power terminal 42 is electrically connected via the electrical conductor 33 to the semiconductor elements 10B.

As shown in FIG. 15, the pair of power terminals 43A and 43B are electrically connected to a junction at which the semiconductor elements 10A and the semiconductor elements 10B are connected. The pair of power terminals 43A and 43B outputs the AC voltage converted by the semiconductor elements 10A and 10B. In a different example of the semiconductor device A1, only one of the power terminals 43A and 43B may be provided. In such an example, the one power terminal 43A or 43B may be located in the middle in the y direction.

As shown in FIGS. 2 and 4, each of the pair of power terminals 43A and 43B includes an end portion 431, a base portion 432 and a standing portion 433. The end portion 431 of the power terminal 43A is formed along the surface of the terminal mount 771 facing in the z2 direction. The base portion 432 is located in the z1 direction from the end portion 431 and is parallel to the end portion 431. The standing portion 433 connects the end portion 431 and the base portion 432 at their ends in the y1 direction. The standing portion 433 and most of the base portion 432 are enclosed within a space defined by the side wall 731 and the terminal mount 771. The base portion 432 has a comb-like portion 434 at the end in the x1 direction, with prongs extending inwardly of the casing 71. As shown in FIGS. 4 and 7, the comb-like portion 434 is bonded to the second bonding portion 322 of the electrical conductor 32. A variety of bonding methods may be used for this bonding, including bonding by using an electrically bonding material (such as solder or sintered metal), laser bonding, or ultrasonic bonding. By this bonding, the power terminal 43B is electrically connected via the electrical conductor 32 to the semiconductor elements 10A and 10B. Similarly, the end portion 431 of the power terminal 43B is formed along the surface of the terminal mount 772 facing in the z2 direction. The base portion 432 is located in the z1 direction from the end portion 431 and is parallel to the end portion 431. The standing portion 433 connects the end portion 431 and the base portion 432 at their ends in the y2 direction. The standing portion 433 and most of the base portion 432 are enclosed within a space defined by the side wall 731 and the terminal mount 772. The base portion 432 has a comb-like portion 434 at the end in the x1 direction, with prongs extending inwardly of the casing 71. As shown in FIGS. 4 and 7, the comb-like portion 434 is bonded to the second bonding portion 322 of the electrical conductor 32. A variety of bonding methods may be used for this bonding, including bonding by using an electrically bonding material (such as solder or sintered metal), laser bonding, or ultrasonic bonding. By this bonding, the power terminal 43B is electrically connected via the electrical conductor 32 to the semiconductor elements 10A and 10B.

As shown in FIGS. 2 and 4, each of the power terminals 41, 42, 43A and 43B has an insertion through hole. When the semiconductor device A1 is mounted on a target, the power terminals 41, 42, 43A and 43B can be fastened to a power supply or a load integrated in the target, by inserting bolts (not shown) through the insertion through holes and tightening the nuts mentioned above.

The pair of signal terminals 44A an 44B are used to input a control signal for controlling the switching operations of the semiconductor elements 10A and 10B. As shown in FIG. 15, the signal terminal 44A is electrically connected to the third electrodes 13 (gate electrodes) of the semiconductor elements 10A. A control signal inputted to the signal terminal 44A controls the switching operations of the semiconductor elements 10A. As shown in FIG. 15, the signal terminal 44B is electrically connected to the third electrodes 13 (gate electrodes) of the semiconductor elements 10B. A control signal inputted to the signal terminal 44B controls the switching operations of the semiconductor elements 10B.

Each of the pair of signal terminals 44A and 44B includes a pad portion 441 and a terminal portion 442 as shown in FIGS. 5 and 7. The pad portions 441 of the signal terminals 44A and 44B are enclosed in the casing 71 (the frame 73). As shown in FIG. 7, a connecting member 56A is bonded to the pad portion 441 of the signal terminal 44A to electrically connect the signal terminal 44A to the electrical conductor 34A. As shown in FIG. 5, a connecting member 56B is bonded to the pad portion 441 of the signal terminal 44B to electrically connect the signal terminal 44B to the electrical conductor 34B. The terminal portions 442 of the signal terminals 44A and 44B are exposed from the casing 71. The portion of the signal terminal 44A that connects the pad portion 441 and the terminal portion 442 penetrates through the side wall 734. With this configuration, the signal terminal 44A is supported on the casing 71 (the frame 73). The portion of the signal terminal 44B that connects the pad portion 441 and the terminal portion 442 penetrates through the side wall 733. With this configuration, the signal terminal 44B is supported on the casing 71 (the frame 73).

The pair of sensing terminals 45A and 45B output sensed signals (source signal) indicating the operating states of the semiconductor elements 10A and 10B. As can be seen from FIG. 15, the sensing terminal 45A is electrically connected to the fourth electrodes 14 (source-sensing electrodes) of the semiconductor elements 10A and outputs a voltage responsive to the voltage applied to the fourth electrodes 14 of the semiconductor elements 10A. As can be seen from FIG. 15, the sensing terminal 45B is electrically connected to the fourth electrodes 14 (source-sensing electrodes) of the semiconductor elements 10B and outputs a voltage responsive to the voltage applied to the fourth electrodes 14 of the semiconductor elements 10B.

Each of the pair of sensing terminals 45A and 45B includes a pad portion 451 and a terminal portion 452 as shown in FIGS. 5 and 7. The pad portions 451 of the sensing terminals 45A and 45B are contained in the casing 71 (the frame 73). As shown in FIG. 7, a connecting member 57A is bonded to the pad portion 451 of the sensing terminal 45A to electrically connect the sensing terminal 45A to the electrical conductor 35A. As shown in FIG. 7, the pad portion 451 of the sensing terminal 45B is electrically connected to the electrical conductor 35B via a connecting member 57B. The terminal portions 452 of the sensing terminals 45A and 45B are exposed from the casing 71. The portion of the sensing terminal 45A that connects the pad portion 451 and the terminal portion 452 penetrates through the side wall 734. With this configuration, the sensing terminal 45A is supported on the casing 71 (the frame 73). The portion of the sensing terminal 45B that connects the pad portion 451 and the terminal portion 452 penetrates through the side wall 733. With this configuration, the sensing terminal 45B is supported on the casing 71 (the frame 73).

In an example in which a thermistor is connected to the pair of electrical conductors 36, the pair of sensing terminals 46 are used to sense the internal temperature of the casing 71. In the example shown in FIG. 5, since no thermistor is connected to the pair of electrical conductors 36, the sensing terminals 46 are dummy terminals.

Each of the pair of sensing terminals 46 includes a pad portion 461 and a terminal portion 462 as shown in FIG. 5. The pad portions 461 of the sensing terminals 46 are contained in the casing 71 (the frame 73). The terminal portion 462 of each sensing terminal 46 is exposed from the casing 71. The portion of each sensing terminal 46 that connects the pad portion 461 and the terminal portion 462 penetrates through the side wall 734. With this configuration, each sensing terminal 46 is supported on the casing 71 (the frame 73). In an example in which a thermistor is connected to the pair of electrical conductors 36, the pad portions 461 may be connected to the electrical conductors 36 by connecting members (e.g., bonding wires). Then, the sensing terminals 46 can act as temperature sensing terminals for detecting the internal temperature of the casing 71.

The sensing terminal 47 outputs a sensed signal (supply voltage signal) responsive to the DC voltage applied to the second electrodes 12 (drain electrodes) of the semiconductor elements 10A. As can be seen from FIG. 15, the sensing terminal 47 is electrically connected to the second electrodes 12 (drain electrodes) of the semiconductor elements 10B. The sensing terminal 47 outputs the voltage (supply voltage) applied to the second electrodes 12 of the semiconductor elements 10B.

The sensing terminals 47 includes a pad portion 471 and a terminal portion 472 as shown in FIG. 7. The pad portion 471 is contained in the casing 71 (the frame 73). As shown in FIG. 7, a connecting member 58 is bonded to the pad portion 471 to electrically connect the pad portion 471 to the extended portion 313 (the electrical conductor 31). The terminal portions 472 is exposed from the casing 71. The portion of the sensing terminal 47 that connects the pad portion 471 and the terminal portion 472 penetrates through the side wall 734. With this configuration, the sensing terminal 47 is supported on the casing 71 (the frame 73).

Each of the connecting members 51, 52, 53A, 53B, 54A, 54B, 55A, 55B, 56A, 56A, 57A, 57B and 58 is used to electrically connect two separate portions.

The connecting members 51 and 52 may be metal plates. The connecting members 51 and 52 are made of copper or a copper alloy, for example. In an alternative example, the connecting members 51 and 52 may be laminated plates of composite material instead of metal plates.

As shown in FIGS. 4 to 7 and 12, each connecting member 51 is bonded to the first electrode 11 (source electrode) of a semiconductor element 10A and also to the second pad portion 321 of the electrical conductor 32. Each connecting member 51 electrically connects the first electrode 11 of the corresponding semiconductor element 10A to the second pad portion 321. In plan view, each connecting member 51 has the shape of a band extending in the y direction as shown in FIGS. 4 to 7.

As shown in FIGS. 4 to 7 and 12, each connecting member 52 is bonded to the first electrode 11 (source electrode) of a semiconductor element 10B and also to the third pad portion 331 of the electrical conductor 33. Each connecting member 52 electrically connects the first electrode 11 of the corresponding semiconductor element 10B to the third pad portion 331. In plan view, each connecting member 52 has the shape of a band extending in the y direction as shown in FIGS. 4 to 7.

The connecting members 53A, 53B, 54A, 54B, 55A, 55B, 56A, 56A, 57A, 57B and 58 are bonding wires. The connecting members 53A, 53B, 54A, 54B, 55A, 55B, 56A, 56A, 57A, 57B and 58 are made of aluminum, gold, copper or an alloy containing such a metal.

As shown in FIG. 6, the connecting member 53A is bonded to the first electrode 21 (anode) of the rectifier element 20A and also to the second pad portion 321 of the electrical conductor 32, providing an electrical connection between them. The first electrode 21 (anode) of the rectifier element 20A is therefore electrically connected to the first electrodes 11 (source electrodes) of the semiconductor elements 10A via the connecting member 53A, the electrical conductor 32 and the connecting members 51. As shown in FIG. 6, the connecting member 53B is bonded to the first electrode 21 (anode) of the rectifier element 20B and also to the third pad portion 331 of the electrical conductor 33, providing an electrical connection between them. The first electrode 21 (anode) of the rectifier element 20B is therefore electrically connected to the first electrodes 11 (source electrodes) of the semiconductor elements 10B via the connecting member 53B, the electrical conductor 33 and the connecting members 52.

As shown in FIGS. 5 to 7, each connecting member 54A is bonded to the third electrode 13 (gate electrode) of a semiconductor element 10A and also to the electrical conductor 34A, providing an electrical connection between them. As shown in FIGS. 5 to 7, each connecting member 54B is bonded to the third electrode 13 (gate electrode) of a semiconductor element 10B and also to the electrical conductor 34B, providing an electrical connection between them.

As shown in FIGS. 5 to 7, each connecting member 55A is bonded to the fourth electrode 14 (source-sensing electrode) of a semiconductor element 10A and also to the electrical conductor 35A, providing an electrical connection between them. As shown in FIGS. 5 to 7, each connecting member 55B is bonded to the fourth electrode 14 (source-sensing electrode) of a semiconductor element 10B and also to the electrical conductor 35B, providing an electrical connection between them.

As shown in FIG. 7, the connecting member 56A is bonded to the electrical conductor 34A and also to the pad portion 441 of the signal terminal 44A, providing an electrical connection between them. As described above, the electrical conductor 34A is electrically connected to the third electrodes 13 (gate electrodes) of the semiconductor elements 10A via the connecting members 54A. The signal terminal 44A is therefore electrically connected to the third electrodes 13 (gate electrodes) of the semiconductor elements 10A via the connecting member 56A, the electrical conductor 34A and the connecting members 54A. The signal terminal 44A thus serves as an input terminal for supplying a control signal to the third electrodes 13 (gate electrodes) of the semiconductor elements 10A. As shown in FIG. 5, the connecting member 56B is bonded to the electrical conductor 34B and also to the pad portion 441 of the signal terminal 44B, providing an electrical connection between them. As described above, the electrical conductor 34B is electrically connected to the third electrodes 13 (gate electrodes) of the semiconductor elements 10B via the connecting members 54B. The signal terminal 44B is therefore electrically connected to the third electrodes 13 (gate electrodes) of the semiconductor elements 10B via the connecting member 56B, the electrical conductor 34B and the connecting members 54B. The signal terminal 44B thus serves as an input terminal for supplying a control signal to the third electrodes 13 (gate electrodes) of the semiconductor elements 10B.

As shown in FIG. 7, the connecting member 57A is bonded to the electrical conductor 35A and also to the pad portion 451 of the sensing terminal 45A, providing an electrical connection between them. As described above, the electrical conductor 35A is electrically connected to the fourth electrodes 14 (source-sensing electrodes) of the semiconductor elements 10A via the connecting members 55A. The sensing terminal 45A is therefore electrically connected to the fourth electrodes 14 (source-sensing electrodes) of the semiconductor elements 10A via the connecting member 57A, the electrical conductor 35A and the connecting members 55A. The sensing terminal 45A is thus used for detecting a source current outputted from the fourth electrodes 14 (source-sensing electrodes) of the semiconductor elements 10A. As shown in FIG. 5, the connecting member 57B is bonded to the electrical conductor 35B and also to the pad portion 451 of the sensing terminal 45B, providing an electrical connection between them. As described above, the electrical conductor 35B is electrically connected to the fourth electrodes 14 (source-sensing electrodes) of the semiconductor elements 10B via the connecting members 55B. The sensing terminal 45B is therefore electrically connected to the fourth electrodes 14 (source-sensing electrodes) of the semiconductor elements 10B via the connecting member 57B, the electrical conductor 35B and the connecting members 55B. The sensing terminal 45B is thus used for detecting a source current outputted from the fourth electrodes 14 (source-sensing electrodes) of the semiconductor elements 10B.

As shown in FIG. 7, the connecting member 58 is bonded to the extended portion 313 of the electrical conductor 31 and also to the pad portion 471 of the sensing terminal 47, providing an electrical connection between them. As described above, the electrical conductor 31 is electrically connected to the second electrodes 12 (drain electrodes) of the semiconductor elements 10A. The sensing terminal 47 is therefore electrically connected to the second electrodes 12 (drain electrodes) of the semiconductor elements 10A via the connecting member 58 and the electrical conductor 31.

In a different example of the semiconductor device A1 in which a thermistor is connected to the pair of electrical conductors 36, additional connecting members may be provided for connecting the electrical conductors 36 to the sensing terminals 46 (the pad portions 461).

Advantages of the semiconductor device A1 will be described.

The semiconductor device A1 includes a plurality of first semiconductor elements (the semiconductor elements 10A or the semiconductor elements 10B) and at least one first rectifier element (the rectifier element 20A or the rectifier element 20B). The first rectifier element is electrically connected in anti-parallel to the first semiconductor elements. With this configuration, when a surge current is generated during switching operations of the first semiconductor elements, the first rectifier element becomes conductive, so that the electric current flowing into the body diodes of the first semiconductor elements will be reduced. In other words, the semiconductor device A1 configured to suppress the electric current otherwise supplied to the body diodes of the first semiconductor elements, thereby preventing the characteristics of the first semiconductor elements from deteriorating.

The semiconductor elements 10A of the semiconductor device A1 include the first element 101A and the second element 102A that are mutually different in the lengths of their minimum conduction paths to the power terminal 41. The minimum conduction path of the first element 101A is shorter than the minimum conduction path of the second element 102A. The rectifier element 20A is located in the first section 311a to which at least the first element 101A is bonded. The studies conducted by the present inventors show the following. Considering a semiconductor device not provided with a rectifier element 20A, when a surge current is induced by switching operations of the semiconductor elements 10A, a larger electric current will flow through the body diode for a semiconductor element 10A having a shorter minimum conduction path to the power terminal 41. That is, a larger electric current will flow through the body diode and thus a risk of causing an excessive current becomes greater for a semiconductor element 10A having a shorter minimum conduction path to the power terminal 41 (in particular the first element 101A) than a semiconductor element 10A having a longer minimum conduction path to the power terminal 41 (in particular the second element 102A). In view of this, the semiconductor device A1 is provided with the rectifier element 20A in the first section 311a of the first pad portion 311. This is effective to reduce the electric current flowing through the body diode of the first element 101A, which is the semiconductor element 10A involving a relatively greater risk of causing an excessive current. The semiconductor device A1 is therefore capable of preventing an excessive current from flowing through the body diode of the first element 101A and thus preventing the characteristics of the first element 101A from deteriorating. Moreover, the semiconductor device A1 achieves this advantage with a fewer number of rectifier elements 20A than the semiconductor elements 10A, i.e., without requiring as many rectifier elements 20A as the semiconductor elements 10A.

The semiconductor elements 10B of the semiconductor device A1 include the third element 101B and the fourth element 102B that are mutually different in the lengths of their minimum conduction paths to the power terminal 41. The minimum conduction path of the third element 101B is shorter than the minimum conduction path of the fourth element 102B. The rectifier element 20B is located in the third section 321a to which at least the third element 101B is bonded. The studies conducted by the present inventors show the following. Like in the semiconductor elements 10A, a larger electric current will flow through the body diode for a semiconductor element 10A having a shorter minimum conduction path to the power terminal 41. That is, a larger electric current will flow through the body diode and thus a risk of causing an excessive current becomes greater for a semiconductor element 10B having a shorter minimum conduction path to the power terminal 41 (in particular the first element 101B) than a semiconductor element 10B having a longer minimum conduction path to the power terminal 41 (in particular the second element 102B). In view of this, the semiconductor device A1 is provided with the rectifier element 20B in the third section 321a of the second pad portion 321. This is effective to reduce the electric current flowing through the body diode of the first element 101B, which is the semiconductor element 10B involving a relatively greater risk of causing an excessive current. The semiconductor device A1 is therefore capable of preventing an excessive current from flowing through the body diode of the first element 101B and thus preventing the characteristics of the first element 101B from deteriorating. Moreover, the semiconductor device A1 achieves this advantage with a fewer number of rectifier elements 20B than the semiconductor elements 10B, i.e., without requiring as many rectifier elements 20B as the semiconductor elements 10B.

In the semiconductor device A1, the first element 101A is one of the semiconductor elements 10A whose minimum conduction path to the power terminal 41 is shortest among the respective minimum conduction paths of the semiconductor elements 10A to the power terminal 41. In addition, the rectifier element 20A is adjacent to the first element 101A. This configuration is effective for the rectifier element 20A to prevent an excessive current flowing through the body diode of the first element 101A. In particular, the rectifier element 20A is located between the first element 101A and the end of the first section 311a connected to the first bonding portion 312 where the power terminal 41 is bonded. According to the studies by the present inventors, this location of the rectifier element 20A is effective to reduce the electric current flowing through the body diode of the first element 101A. The first element 101A involves a relatively greater risk of causing an excessive current flowing through the body diode because its minimum conduction path to the power terminal 41 is shortest among those of the plurality of semiconductor elements 10A. The rectifier element 20A arranged in such a location is preferable for the semiconductor device A1 to effectively prevent an excessive current from flowing through the body diode of the first element 101A involving such a risk and thus preferable for preventing the characteristics of the first semiconductor elements 10A from deteriorating.

In the semiconductor device A1, the third element 101B is one of the semiconductor elements 10B the minimum conduction path of which to the power terminal 41 is shortest among the respective minimum conduction paths of the semiconductor elements 10B to the power terminal 41. In addition, the rectifier element 20B is adjacent to the first element 101B. This configuration is effective for the rectifier element 20B to prevent an excessive current flowing through the body diode of the first element 101B. The rectifier element 20B arranged in such a location is preferable for the semiconductor device A1 to effectively prevent an excessive current from flowing through the body diode of the first element 101B involving such a risk, thereby and thus preferable for preventing the characteristics of the first semiconductor elements 10B from deteriorating.

The semiconductor device A1 includes the semiconductor elements 10A arranged side by side in a direction (x direction) perpendicular to the direction in which the power terminals 41 and 42 are arranged (y direction). This arrangement results in greater differences among the minimum conduction paths from the power terminal 41 to the respective semiconductor elements 10A. The difference is a factor in increasing the electric current supplied to the body diode of the first element 101A. Providing the semiconductor device A1 with the rectifier element 20A near the first element 101A is therefore effective to prevent the characteristics of the semiconductor elements 10A from deteriorating. Similarly, the semiconductor elements 10B in the semiconductor device A1 are arranged side by side in a direction (x direction) perpendicular to the direction in which the power terminals 41 and 42 are arranged (y direction). Providing the semiconductor device A1 with the rectifier element 20B near the third element 101B is therefore effective to prevent the characteristics of the semiconductor elements 10B from deteriorating.

Figure 16:
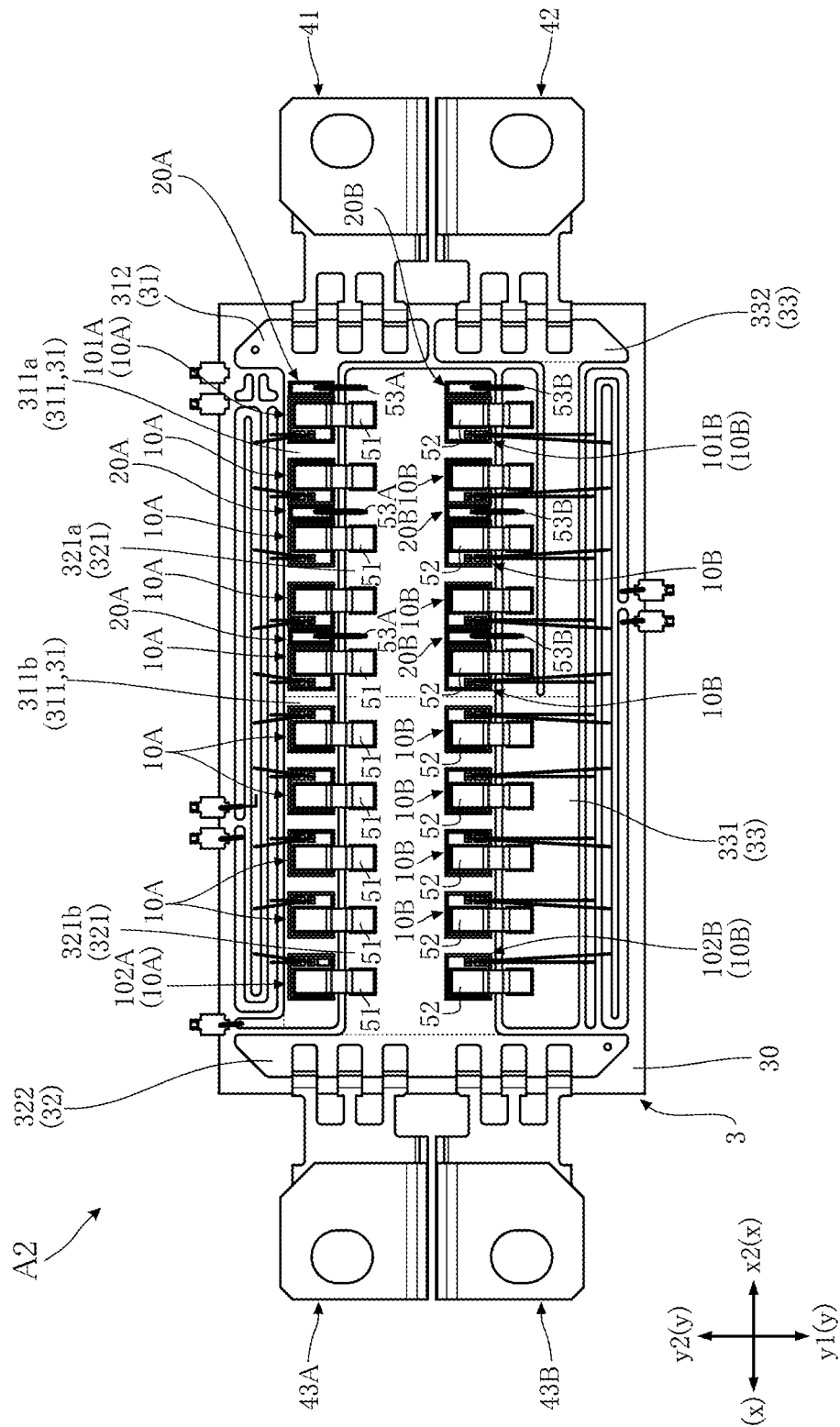
FIG. 16 is a plan view of a semiconductor device according to a second embodiment.

FIG. 16 shows a semiconductor device A2 according to a second embodiment. FIG. 16 is a plan view showing the semiconductor device A2, with the heat-dissipating plate 70 and the casing 71 omitted. Unlike the semiconductor device A1, the semiconductor device A2 includes a plurality of rectifier elements 20A and a plurality of rectifier elements 20B.

In FIG. 16, the semiconductor device A2 includes three rectifier elements 20A and three rectifier elements 20B. The three rectifier elements 20A are bonded to the first section 311a of the first pad portion 311. Similarly to the semiconductor device A1, the rectifier elements 20A of the semiconductor device A2 are not bonded to the second section 311b.

In the example shown in FIG. 16, the rectifier elements 20A are located on the first section 311a in the following order from the end in the x2 direction (closer to the power terminal 41) to the end in the x1 direction: a rectifier element 20A, a semiconductor element 10A (the first element 101A), a semiconductor element 10A, a rectifier element 20A, a semiconductor element 10A, a semiconductor element 10A, a rectifier element 20A and a semiconductor element 10A. This arrangement shown in FIG. 16 is an example and the arrangement of the rectifier elements 20A is not limited to this example. In an alternative example to FIG. 16, all the rectifier elements 20A may be arranged around the first element 101A.

The three rectifier elements 20B are bonded to the third section 321a of the second pad portion 321. Similarly to the semiconductor device A1, the rectifier elements 20B of the semiconductor device A2 are not bonded to the fourth section 321b.

In the example shown in FIG. 16, the rectifier elements 20B are located on the third section 321a in the following order from the end in the x2 direction (closer to the power terminal 41) to the end in the x1 direction: a rectifier element 20B, a semiconductor element 10B (the third element 101B), a semiconductor element 10B, a rectifier element 20B, a semiconductor element 10B, a semiconductor element 10B, a rectifier element 20B and a semiconductor element 10B. This arrangement shown in FIG. 16 is an example and the arrangement of the rectifier elements 20B is not limited to this example. In an alternative example to FIG. 16, all the rectifier elements 20B may be arranged around the third element 101B.

The semiconductor device A2 can achieve the advantages similar to those achieved by the semiconductor device A1. In particular, the location of one of the rectifier elements 20A in the semiconductor device A2 corresponds to the location of the rectifier element 20A in the semiconductor device A1. As in the semiconductor device A1, the semiconductor device A2 can reduce the electric current flowing through the body diode of the first element 101A (the semiconductor element 10A), which involves a relatively greater risk of causing an excessive current. In particular, the location of one of the rectifier elements 20B in the semiconductor device A2 corresponds to the location of the rectifier element 20B in the semiconductor device A1. As in the semiconductor device A1, the semiconductor device A2 can reduce the electric current flowing through the body diode of the third element 101B (the semiconductor element 10B), which involves a relatively greater risk of causing an excessive current.

The second embodiment is not limited to the example shown in FIG. 16 as to the number and arrangement of the rectifier elements 20A. As long as at least one rectifier element 20A is bonded to the first section 311a, other rectifier elements 20A may be bonded to either the first section 311a or the second section 311b. Yet, bonding all the rectifier elements 20A to the first section 311a is more effective to prevent the characteristics of the semiconductor elements 10A from deteriorating. Similarly, the number and arrangement of the rectifier elements 20B are not limited to the example shown in FIG. 1. As long as at least one rectifier element 20B is bonded to the third section 321a, other rectifier elements 20B may be bonded to either the third section 321a or the fourth section 321b. Yet, bonding all the rectifier elements 20B to the third section 321a is more effective to prevent the characteristics of the semiconductor elements 10B from deteriorating.

Figure 17:
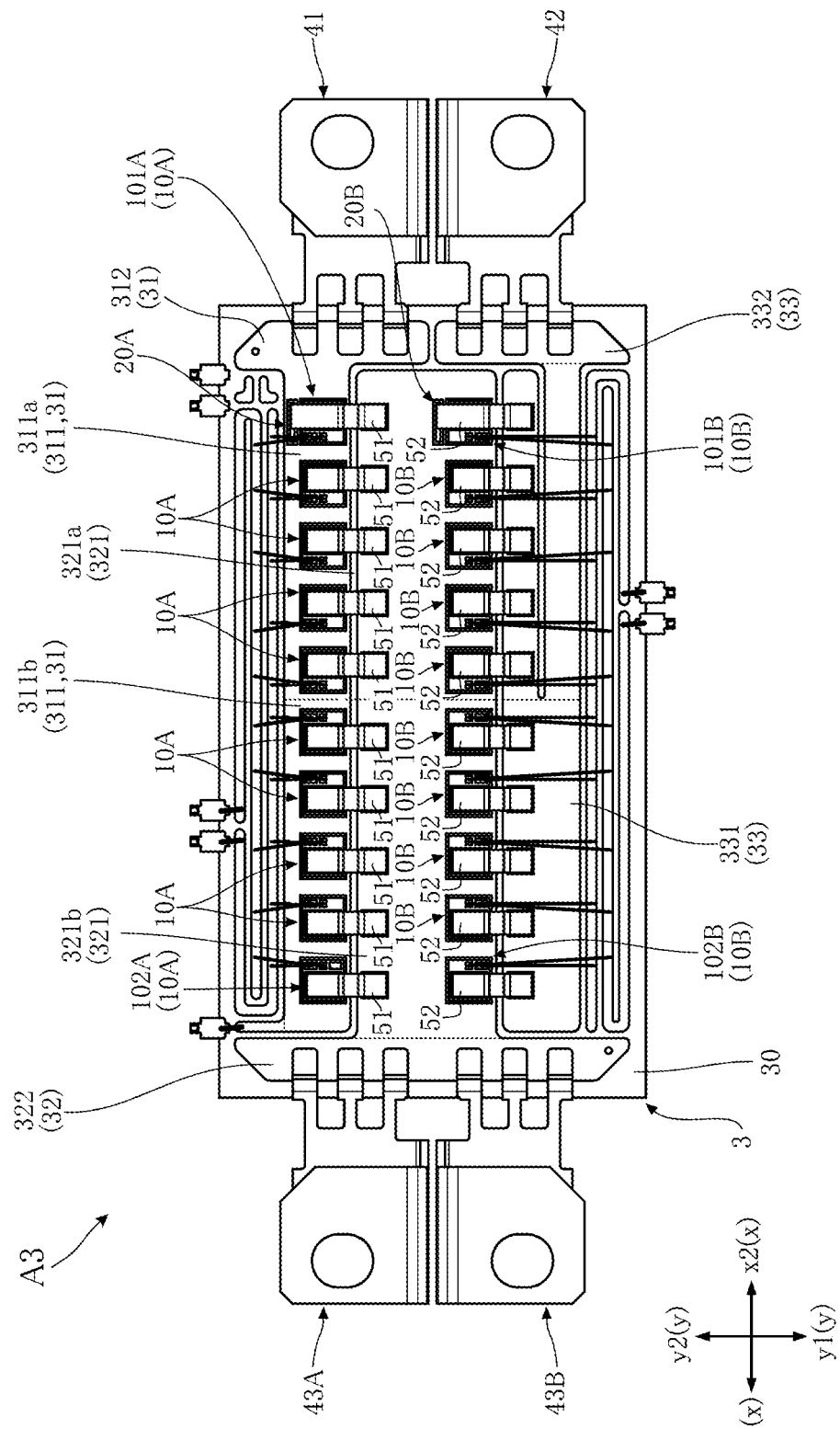
FIG. 17 is a plan view of a semiconductor device according to a third embodiment.

FIG. 17 shows a semiconductor device A3 according to a third embodiment. FIG. 17 is a plan view showing the semiconductor device A3, with the heat-dissipating plate 70 and the casing 71 omitted. The rectifier element s20A and 20B of the semiconductor device A3 are arranged and bonded differently from the semiconductor device A1.

In the present embodiment, the rectifier element 20A is located in the y2 direction from the first element 101A. In addition, the connecting member 51 that is bonded to the first element 101A has a portion overlapping with the rectifier element 20A in plan view as shown in FIG. 17. This overlapping portion is bonded to the first electrode 21 (anode) of the rectifier element 20A. In this way, the first electrode 21 (anode) of the rectifier element 20A is electrically connected to the first electrode 11 (source electrode) of the first element 101A via the connecting member 51.

In the present embodiment, the rectifier element 20B is located in the y2 direction from the third element 101B. In addition, the connecting member 52 that is bonded to the first element 101A has a portion overlapping with the rectifier element 20B in plan view as shown in FIG. 17. This overlapping portion is bonded to the first electrode 21 (anode) of the rectifier element 20B. In this way, the first electrode 21 (anode) of the rectifier element 20B is electrically connected to the first electrode 11 (source electrode) of the third element 101B via the connecting member 52.

The semiconductor device A3 can achieve the advantages similar to those achieved by the semiconductor device A1.

Although the rectifier element 20A in the third embodiment is located in the y2 direction from the first element 101A, the rectifier element 20A may be located in the y1 direction from the first element 101A in another example. Similarly, although the rectifier element 20B in the third embodiment is located in the y2 direction from the third element 101B, the rectifier element 20B may be located in the y1 direction from the third element 101B in another example.

The third embodiment is directed to the semiconductor device A3 that includes one rectifier element 20A and one rectifier element 20B. In another example, the semiconductor device A3 may include a plurality of rectifier elements 20A and a plurality of rectifier element 20B as in the semiconductor device A2. Even in such an example, the number of rectifier elements 20A is fewer than the number of semiconductor elements 10A, and the number of rectifier elements 20B is fewer than the number of the semiconductor elements 10B.

Figure 18:
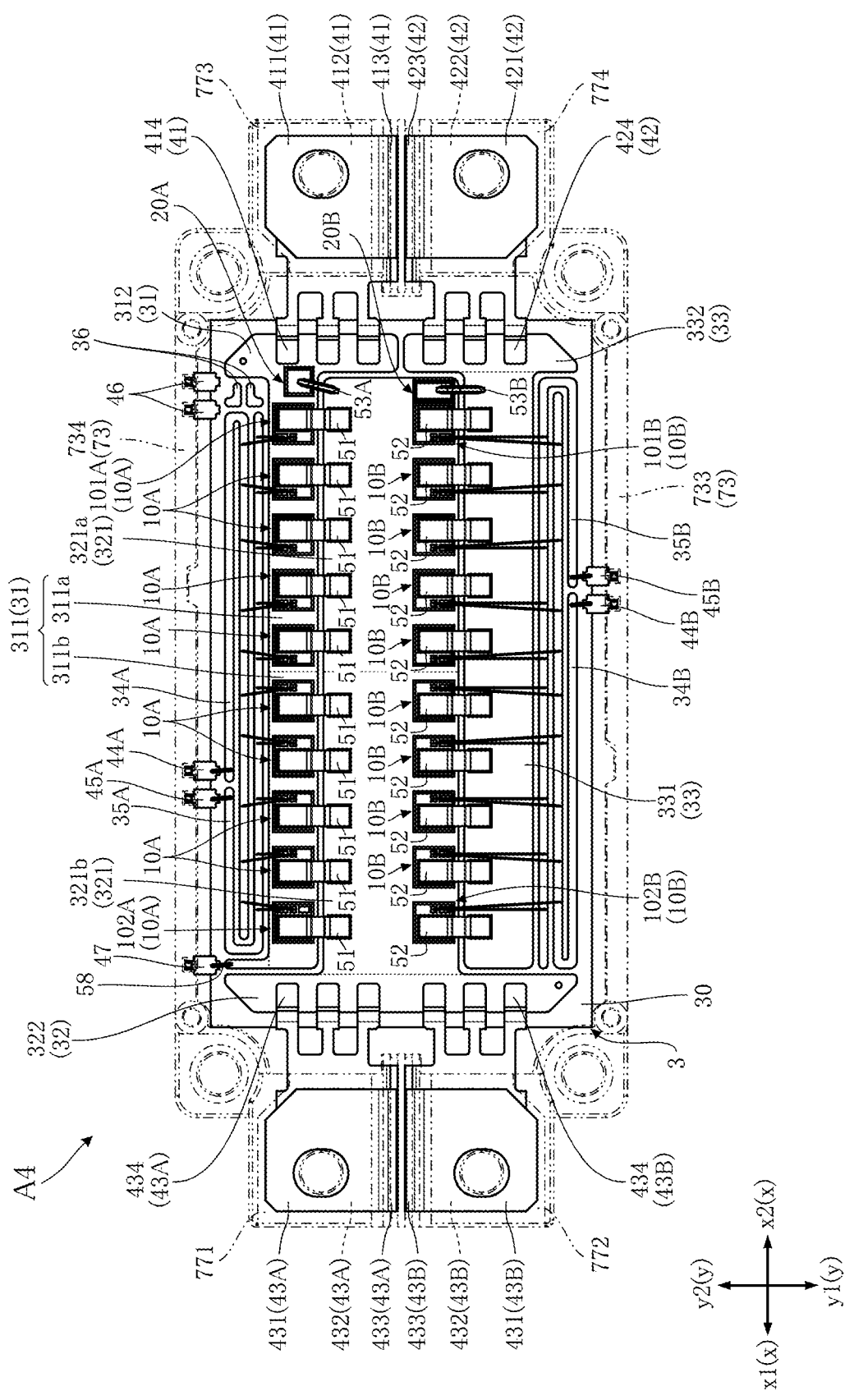
FIG. 18 is a plan view of a semiconductor device according to a fourth embodiment.

FIG. 18 shows a semiconductor device A4 according to a fourth embodiment. FIG. 18 is a plan view of the semiconductor device A4, with the heat-dissipating plate 70 and the casing 71 shown in phantom (chain double-dashed line). The semiconductor device A4 differs from the semiconductor device A1 in that the third pad portion 331 of the electrical conductor 33 is not formed with a slit 331c.

In particular, the third pad portion 331 of the semiconductor device A4 has the shape of a band extending in the x direction from the third bonding portion 332. Since no slit 331c is formed, the third pad portion 331 is not branched into a pair of branched portions 331a.

The semiconductor device A4 can achieve the advantages similar to those achieved by the semiconductor device A1.

Each of the semiconductor devices A1 to A4 according to the first to fourth embodiments has at least one rectifier element 20A and at least one rectifier element 20B. In an alternative example, either the rectifier element(s) 20A or the rectifier element(s) 20B may be omitted from the semiconductor device. For example, the difference in the lengths of the respective minimum conduction paths to the power terminal 41 may be relatively small among the semiconductor elements 10A, depending on the arrangements and shapes of the power terminals 41, 42, 43A and 43B, the arrangements and shapes of the electrical conductors 31, 32 and 33, and the arrangement of the semiconductor elements 10A and 10B. Such a semiconductor device may not cause an excessive current to be supplied to the body diodes of the respective semiconductor elements 10A, eliminating the need for a rectifier element 20A. Similarly, the difference in the lengths of the respective minimum conduction paths to the power terminal 41 may be relatively small among the semiconductor elements 10B. Such a semiconductor device may not cause an excessive current to be supplied to the body diodes of the respective semiconductor elements 10B, eliminating the need for a rectifier element 20B.

Figure 19:
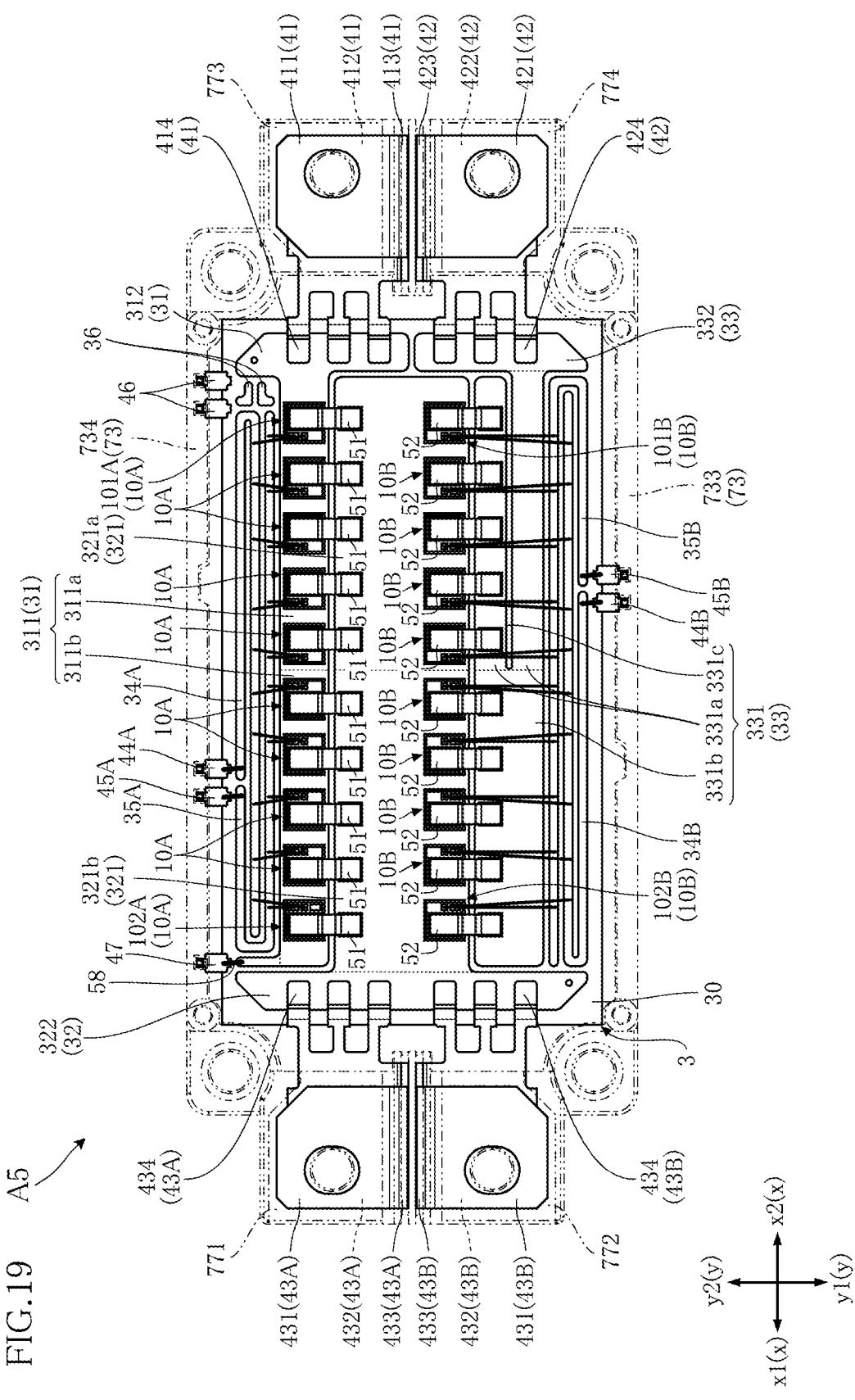
FIG. 19 is a plan view of a semiconductor device according to a fifth embodiment.

FIG. 19 shows a semiconductor device A5 according to a fifth embodiment. FIG. 19 is a plan view of the semiconductor device A5, with the heat-dissipating plate 70 and the casing 71 shown in phantom (chain double-dashed line). Unlike the semiconductor device A1, the semiconductor device A5 is not provided with any rectifier element 20A and any rectifier element 20B.

Like the semiconductor device A1, the semiconductor device A5 includes the third pad portion 331 (the electrical conductor 33) formed with a slit 331c. This configuration allows the semiconductor elements 10B to be arranged to reduce the difference in the lengths of the respective minimum conduction paths to the power terminal 42. Consequently, the internal inductance of the semiconductor device A5 can be reduced as compared with the case where the third pad portion 331 is not formed with a slit 331c. This advantage also applies to the semiconductor devices A1 to A3 each having the third pad portion 331 formed with a slit 331c.

In the first to fifth embodiments, the semiconductor elements 10A and 10B and the supporting member 3 are enclosed by the heat-dissipating plate 70 and the casing 71, but this is not of limitation. In an alternative example, they may be encapsulated in a resin package made, for example, of an epoxy resin.

The semiconductor devices according to the present disclosure are not limited to those of the above-described embodiments. Various design changes can be made to the specific configurations of the elements of the semiconductor devices according to the present disclosure. For example, the semiconductor devices according to the present disclosure include embodiments described in the following clauses.

Clause 1.
A semiconductor device comprising:
a plurality of first semiconductor elements configured to perform a switching operation and electrically connected to each other in parallel;
one or more first rectifier elements electrically connected in anti-parallel to the plurality of first semiconductor elements;
a first power terminal electrically connected to each of the plurality of first semiconductor elements; and
a first electrical conductor electrically connected to the first power terminal and the plurality of first semiconductor elements and including a first pad portion to which the plurality of first semiconductor elements are bonded,
wherein the plurality of first semiconductor elements include a first element and a second element that are mutually different in length of a minimum conduction path to the first power terminal,
the minimum conduction path of the first element is shorter than the minimum conduction path of the second element,
the first pad portion includes a first section to which at least the first element out of the plurality of first semiconductor elements is bonded and a second section to which at least the second element out of the plurality of first semiconductor elements is bonded,
the one or more first rectifier elements are fewer in number than the plurality of first semiconductor elements, and
the one or more first rectifier elements include a first rectifier element located in the first section.

Clause 2.
The semiconductor device according to Clause 1, wherein the one or more first rectifier elements include only a single first rectifier element.

Clause 3.
The semiconductor device according to Clause 1 or 2, further comprising:
a plurality of second semiconductor elements configured to perform a switching operation and electrically connected to each other in parallel; and
a second electrical conductor spaced apart from the first electrical conductor and including a second pad portion to which the plurality of second semiconductor elements are bonded,
wherein each of the plurality of first semiconductor elements is electrically connected in series to each of the plurality of second semiconductor elements.

Clause 4.
The semiconductor device according to Clause 3, further comprising:
a second power terminal electrically connected to each of the plurality of second semiconductor elements; and
a third power terminal electrically connected to a junction at which the plurality of first semiconductor elements and the plurality of second semiconductor elements are connected.

Clause 5.
The semiconductor device according to Clause 4, further comprising a third electrical conductor spaced apart from the first electrical conductor and the second electrical conductor,
wherein the first power terminal is bonded to the first electrical conductor,
the second power terminal is bonded to the third electrical conductor, and
the third power terminal is bonded to the second electrical conductor.

Clause 6.
The semiconductor device according to Clause 5, further comprising:
a plurality of first connecting members electrically connecting the plurality of first semiconductor elements to the second electrical conductor; and
a plurality of second connecting members electrically connecting the plurality of second semiconductor elements to the third electrical conductor,
wherein each of the plurality of first connecting members is bonded to the second pad portion, and
the third electrical conductor includes a third pad portion to which each of the plurality of second connecting members is bonded.

Clause 7.
The semiconductor device according to Clause 6, further comprising one or more second rectifier elements electrically connected in anti-parallel to the plurality of second semiconductor elements,
wherein the plurality of second semiconductor elements include a third element and a fourth element that are mutually different in length of a minimum conduction path to the first power terminal,
the minimum conduction path of the third element is shorter than the minimum conduction path of the fourth element,
the second pad portion includes a third section to which at least the third element out of the plurality of second semiconductor elements is bonded and a fourth section to which at least the fourth element out of the plurality of second semiconductor elements is bonded,
the one or more second rectifier elements are fewer in number than the plurality of second semiconductor elements, and the one or more second rectifier elements include a second rectifier element located in the third section.

Clause 8.

The semiconductor device according to Clause 7, wherein the one or more second rectifier elements include only a single second rectifier element.

Clause 9.

The semiconductor device according to Clause 7 or 8, wherein the first electrical conductor further includes a first bonding portion connected to the first pad portion and to which the first power terminal is bonded, and the first pad portion has a first bonding surface to which each of the plurality of first semiconductor elements is bonded, and as viewed in a thickness direction normal to the first bonding surface, the first pad portion extends from the first bonding portion in a first direction perpendicular to the thickness direction.

Clause 10.

The semiconductor device according to Clause 9, wherein the plurality of first semiconductor elements are located side by side in the first direction, the first element is nearest to the first bonding portion among the plurality of first semiconductor elements, and the minimum conduction path of the first element to the first power terminal is shortest among the respective minimum conduction paths of the plurality of first semiconductor elements, and as viewed in the thickness direction, the one or more first rectifier elements include a first rectifier element located between the first element and an end of the first section connected to the first bonding portion.

Clause 11.

The semiconductor device according to Clause 10, wherein the second electrical conductor further includes a second bonding portion connected to the second pad portion and to which the third power terminal is bonded, and as viewed in the thickness direction, the second pad portion extends from the second bonding portion in the first direction.

Clause 12.

The semiconductor device according to Clause 11, wherein the plurality of second semiconductor elements are located side by side in the first direction.

Clause 13.

The semiconductor device according to Clause 12, wherein the third electrical conductor further includes a third bonding portion connected to the third pad portion and to which the second power terminal is bonded, and as viewed in the thickness direction, the third pad portion extends from the third bonding portion in the first direction.

Clause 14.

The semiconductor device according to Clause 13, wherein the first pad portion, the second pad portion and the third pad portion overlap with each other as viewed in a second direction perpendicular to the thickness direction and the first direction, and the first pad portion and the third pad portion are located opposite in the second direction with the second pad portion in between.

Clause 15.

The semiconductor device according to Clause 14, wherein the first power terminal and the second power terminal are located side by side in the second direction.

Clause 16.

The semiconductor device according to Clause 15, wherein the first power terminal and the second power terminal are located opposite from the third power terminal in the first direction with the first pad portion, the second pad portion and the third pad portion located in between.

Clause 17.

The semiconductor device according to Clause 16, wherein as viewed in the second direction, the plurality of first semiconductor elements overlap with the plurality of second semiconductor elements;

as viewed in the thickness direction, each of the first connecting members extends in the second direction, and as viewed in the thickness direction, each of the plurality of second connecting members extends in the second direction.

Clause 18.

The semiconductor device according to Clause 17, wherein as viewed in the second direction, the first element and the third element overlap with each other, the minimum conduction path of the third element to the first power terminal is shortest among the respective minimum conduction paths of the plurality of second semiconductor elements, and as viewed in the thickness direction, one of the one or more second rectifier elements is located between the third element and an end of the third section closer to the first power terminal in the first direction.

Clause 19.

The semiconductor device according to Clause 18, wherein the third pad portion includes a slit extending in the first direction as viewed in the thickness direction, and a pair of branched portions separated from each other in the second direction by the slit, and each of the pair of branched portions overlaps with the third section as viewed in the second direction.

Clause 20.

The semiconductor device according to any one of Clauses 7 to 19, wherein each of the first semiconductor elements and the second semiconductor elements comprises an MOSFET, and the one or more first rectifier elements and the one or more second rectifier elements comprise Schottky barrier diodes.

REFERENCE SIGNS

A1 to A5: Semiconductor device
10A, 10B: Semiconductor element
100a: Element obverse surface
100b: Element reverse surface
101A: First element
101B: Third element
11: First electrode
13: Third electrode
20A, 20B: Rectifier element
102A: Second element
102B: Fourth element
12: Second electrode
14: Fourth electrode

| | |
|---|---|
| 200a: Element obverse surface | |
| 200b: Element reverse surface | |
| 21: First electrode | 22: Second electrode |
| 3: Supporting member | 30: Insulating substrate |
| 301: Obverse surface | 302: Reverse surface |
| 31: Electrical conductor | 311: First pad portion |
| 311A: First section | 311B: Second section |
| 311z: First bonding surface | 312: First bonding portion |
| 313: Extended portion | 32: Electrical conductor |
| 321: Second pad portion | 321A: Third section |
| 321B: Fourth section | 321z: Second bonding surface |
| 322: Second bonding portion | 33: Electrical conductor |
| 331: Third pad portion | 331A: Branched portion |
| 331B: Connecting portion | 331c: Slit |
| 331z: Third bonding surface | 332: Third bonding portion |
| 34A, 34B: Electrical conductor | 35A, 35B: Electrical conductor |
| 36: Electrical conductor | 41: Power terminal |
| 411: End portion | 412: Base portion |
| 413: Standing portion | 414: Comb-like portion |
| 42: Power terminal | 421: End portion |
| 422: Base portion | 423: Standing portion |
| 424: Comb-like portion | 43A, 43B: Power terminal |
| 431: End portion | 432: Base portion |
| 433: Standing portion | 434: Comb-like portion |
| 44A, 44B: Signal terminal | 441: Pad portion |
| 442: Terminal portion | 45A, 45B: Sensing terminal |
| 451: Pad portion | 452: Terminal portion |
| 46: Sensing terminal | 461: Pad portion |
| 462: Terminal portion | 47: Sensing terminal |
| 471: Pad portion | 472: Terminal portion |
| 51, 52, 53A, 53B, 54A, 54B: Connecting member | |
| 55A, 55B, 56A, 56B, 57A, 57B, 58: Connecting member | |
| 70: Heat-dissipating plate | 71: Casing |
| 72: Top plate | 73: Frame |
| 731 to 734: Side wall | 74: Recessed portion |
| 75: Mounting through-hole | 76: Tubular metal fixture |
| 771 to 774: Terminal mount | |

The invention claimed is:

1. A semiconductor device comprising:
a plurality of first semiconductor elements configured to perform a switching operation and electrically connected to each other in parallel;
one or more first rectifier elements electrically connected in anti-parallel to the plurality of first semiconductor elements;
a first power terminal electrically connected to each of the plurality of first semiconductor elements; and
a first electrical conductor electrically connected to the first power terminal and the plurality of first semiconductor elements and including a first pad portion to which the plurality of first semiconductor elements are bonded,
wherein the plurality of first semiconductor elements include a first element and a second element that are mutually different in length of a minimum conduction path to the first power terminal,
the minimum conduction path of the first element is shorter than the minimum conduction path of the second element,
the first pad portion includes a first section to which at least the first element out of the plurality of first semiconductor elements is bonded and a second section to which at least the second element out of the plurality of first semiconductor elements is bonded,
the one or more first rectifier elements are fewer in number than the plurality of first semiconductor elements,
the one or more first rectifier elements include a first rectifier element located in the first section,
the first electrical conductor further includes a first bonding portion connected to the first pad portion and to which the first power terminal is bonded, and
the first pad portion has a first bonding surface to which each of the plurality of first semiconductor elements is bonded, and as viewed in a thickness direction normal to the first bonding surface, the first pad portion extends from the first bonding portion in a first direction perpendicular to the thickness direction.

2. The semiconductor device according to claim 1, wherein the one or more first rectifier elements include only a single first rectifier element.

3. The semiconductor device according to claim 1, further comprising:
a plurality of second semiconductor elements configured to perform a switching operation and electrically connected to each other in parallel; and
a second electrical conductor spaced apart from the first electrical conductor and including a second pad portion to which the plurality of second semiconductor elements are bonded,
wherein each of the plurality of first semiconductor elements is electrically connected in series to each of the plurality of second semiconductor elements.

4. The semiconductor device according to claim 3, further comprising:
a second power terminal electrically connected to each of the plurality of second semiconductor elements; and
a third power terminal electrically connected to a junction at which the plurality of first semiconductor elements and the plurality of second semiconductor elements are connected.

5. The semiconductor device according to claim 4, further comprising a third electrical conductor spaced apart from the first electrical conductor and the second electrical conductor,
   wherein the first power terminal is bonded to the first electrical conductor,
   the second power terminal is bonded to the third electrical conductor, and
   the third power terminal is bonded to the second electrical conductor.

6. The semiconductor device according to claim 5, further comprising:
   a plurality of first connecting members electrically connecting the plurality of first semiconductor elements to the second electrical conductor; and
   a plurality of second connecting members electrically connecting the plurality of second semiconductor elements to the third electrical conductor,
   wherein each of the plurality of first connecting members is bonded to the second pad portion, and
   the third electrical conductor includes a third pad portion to which each of the plurality of second connecting members is bonded.

7. The semiconductor device according to claim 6, further comprising one or more second rectifier elements electrically connected in anti-parallel to the plurality of second semiconductor elements,
   wherein the plurality of second semiconductor elements include a third element and a fourth element that are mutually different in length of a minimum conduction path to the first power terminal,
   the minimum conduction path of the third element is shorter than the minimum conduction path of the fourth element,
   the second pad portion includes a third section to which at least the third element out of the plurality of second semiconductor elements is bonded and a fourth section to which at least the fourth element out of the plurality of second semiconductor elements is bonded,
   the one or more second rectifier elements are fewer in number than the plurality of second semiconductor elements, and
   the one or more second rectifier elements include a second rectifier element located in the third section.

8. The semiconductor device according to claim 7, wherein the one or more second rectifier elements include only a single second rectifier element.

9. The semiconductor device according to claim 7, wherein each of the plurality of first semiconductor elements and the plurality of second semiconductor elements comprises an MOSFET, and
   the one or more first rectifier elements and the one or more second rectifier elements comprise Schottky barrier diodes.

10. The semiconductor device according to claim 7, wherein the plurality of first semiconductor elements are located side by side in the first direction,
   the first element is nearest to the first bonding portion among the plurality of first semiconductor elements, and the minimum conduction path of the first element to the first power terminal is shortest among the respective minimum conduction paths of the plurality of first semiconductor elements, and
   as viewed in the thickness direction, the one or more first rectifier elements include a first rectifier element located between the first element and an end of the first section connected to the first bonding portion.

11. The semiconductor device according to claim 10, wherein the second electrical conductor further includes a second bonding portion connected to the second pad portion and to which the third power terminal is bonded, and
   as viewed in the thickness direction, the second pad portion extends from the second bonding portion in the first direction.

12. The semiconductor device according to claim 11, wherein the plurality of second semiconductor elements are located side by side in the first direction.

13. The semiconductor device according to claim 12, wherein the third electrical conductor further includes a third bonding portion connected to the third pad portion and to which the second power terminal is bonded, and
   as viewed in the thickness direction, the third pad portion extends from the third bonding portion in the first direction.

14. The semiconductor device according to claim 13, wherein the first pad portion, the second pad portion and the third pad portion overlap with each other as viewed in a second direction perpendicular to the thickness direction and the first direction, and
   the first pad portion and the third pad portion are located opposite in the second direction with the second pad portion in between.

15. The semiconductor device according to claim 14, wherein the first power terminal and the second power terminal are located side by side in the second direction.

16. The semiconductor device according to claim 15, wherein the first power terminal and the second power terminal are located opposite from the third power terminal in the first direction with the first pad portion, the second pad portion and the third pad portion located in between.

17. The semiconductor device according to claim 16, wherein as viewed in the second direction, the plurality of first semiconductor elements overlap with the plurality of second semiconductor elements;
   as viewed in the thickness direction, each of the plurality of first connecting members extends in the second direction, and
   as viewed in the thickness direction, each of the plurality of second connecting members extends in the second direction.

18. The semiconductor device according to claim 17, wherein as viewed in the second direction, the first element and the third element overlap with each other,
   the minimum conduction path of the third element to the first power terminal is shortest among the respective minimum conduction paths of the plurality of second semiconductor elements, and
   as viewed in the thickness direction, one of the one or more second rectifier elements is located between the third element and an end of the third section closer to the first power terminal in the first direction.

19. The semiconductor device according to claim 18, wherein the third pad portion includes a slit extending in the first direction as viewed in the thickness direction, and a pair of branched portions separated from each other in the second direction by the slit, and
   each of the pair of branched portions overlaps with the third section as viewed in the second direction.

20. A semiconductor device comprising:
   a plurality of first semiconductor elements configured to perform a switching operation and electrically connected to each other in parallel;

one or more first rectifier elements electrically connected in anti-parallel to the plurality of first semiconductor elements;

a first power terminal electrically connected to each of the plurality of first semiconductor elements; and a first electrical conductor electrically connected to the first power terminal and the plurality of first semiconductor elements and including a first pad portion to which the plurality of first semiconductor elements are bonded, wherein the plurality of first semiconductor elements include a first element and a second element that are mutually different in length of a minimum conduction path to the first power terminal, the minimum conduction path of the first element is shorter than the minimum conduction path of the second element, the first pad portion includes a first section to which at least the first element out of the plurality of first semiconductor elements is bonded and a second section to which at least the second element out of the plurality of first semiconductor elements is bonded, the one or more first rectifier elements are fewer in number than the plurality of first semiconductor elements, the one or more first rectifier elements include a first rectifier element located in the first section, and the one or more first rectifier elements include only a single first rectifier element.

\* \* \* \* \*